(12) United States Patent
Jiang et al.

(10) Patent No.: US 12,400,947 B2
(45) Date of Patent: Aug. 26, 2025

(54) VARIABLE GRADUATED CAPACITOR STRUCTURE AND METHODS FOR FORMING THE SAME

(71) Applicant: Taiwan Semiconductor Manufacturing Company Limited, Hsinchu (TW)

(72) Inventors: Jheng-Hong Jiang, Hsinchu (TW); Shing-Huang Wu, Hsinchu (TW); Chia-Wei Liu, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/359,950

(22) Filed: Jul. 27, 2023

(65) Prior Publication Data

US 2023/0369200 A1 Nov. 16, 2023

Related U.S. Application Data

(62) Division of application No. 17/318,285, filed on May 12, 2021, now Pat. No. 12,191,247.

(51) Int. Cl.
*H01L 23/522* (2006.01)
*H01L 21/66* (2006.01)
(Continued)

(52) U.S. Cl.
CPC .... *H01L 23/5223* (2013.01); *H01L 21/76802* (2013.01); *H01L 21/7684* (2013.01);
(Continued)

(58) Field of Classification Search
CPC ........... H01L 23/5223; H01L 21/76802; H01L 21/7684; H01L 21/76877; H01L 22/26;
(Continued)

(56) References Cited

U.S. PATENT DOCUMENTS

2003/0178665 A1* 9/2003 Takenaka ................ H01L 28/60
257/E21.018
2004/0056324 A1* 3/2004 Ning ........................ H01L 28/55
257/E21.011

(Continued)

FOREIGN PATENT DOCUMENTS

CN 111755602 A 10/2020

OTHER PUBLICATIONS

TW Patent and Trademark Office; TW Application no. 110132523; Office Action mailed Jan. 20, 2025; 8 pages.

*Primary Examiner* — Eva Y Montalvo
*Assistant Examiner* — Zhijun Xu
(74) *Attorney, Agent, or Firm* — The Marbury Law Group, PLLC

(57) ABSTRACT

Devices and methods of manufacture for a graduated, "step-like," capacitance structure having two or more capacitors. A semiconductor structure comprising a capacitor structure, the capacitor structure comprising a first capacitor and a second capacitor. The first capacitor comprising a first bottom electrode and a top electrode having a bottom surface that is a first distance from a top surface of the first bottom electrode. The second capacitor comprising a second bottom electrode and the top electrode, in which the bottom surface is a second distance from a top surface of the second bottom electrode, and in which the first distance is different from the second distance.

20 Claims, 16 Drawing Sheets

(51) Int. Cl.
  *H01L 21/768* (2006.01)
  *H10D 1/68* (2025.01)
(52) U.S. Cl.
  CPC ........ *H01L 21/76877* (2013.01); *H01L 22/26* (2013.01); *H01L 23/5226* (2013.01); *H10D 1/692* (2025.01)
(58) Field of Classification Search
  CPC ... H01L 23/5226; H01L 28/60; H01L 27/016; H01L 28/40; B24B 37/013
  See application file for complete search history.

(56) References Cited

U.S. PATENT DOCUMENTS

2004/0169255 A1* 9/2004 Kiyotoshi ............... H01L 24/18
  257/532
2018/0366537 A1* 12/2018 Liu ......................... H01L 28/40
2020/0135844 A1* 4/2020 Takahashi ......... H01L 21/76849

* cited by examiner

VARIABLE GRADUATED CAPACITOR STRUCTURE AND METHODS FOR FORMING THE SAME

RELATED APPLICATIONS

This application is a divisional application of U.S. application Ser. No. 17/318,285 entitled "Variable Graduated Capacitor Structure and Methods for Forming the Same," filed on May 12, 2021, the entire contents of which is incorporated herein by reference for all purposes.

BACKGROUND

Embedded capacitors are used in semiconductor chips for a variety of applications. However, tuning the capacitors to a particular capacitance value for a particular application may result in untenable manufacturing times.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
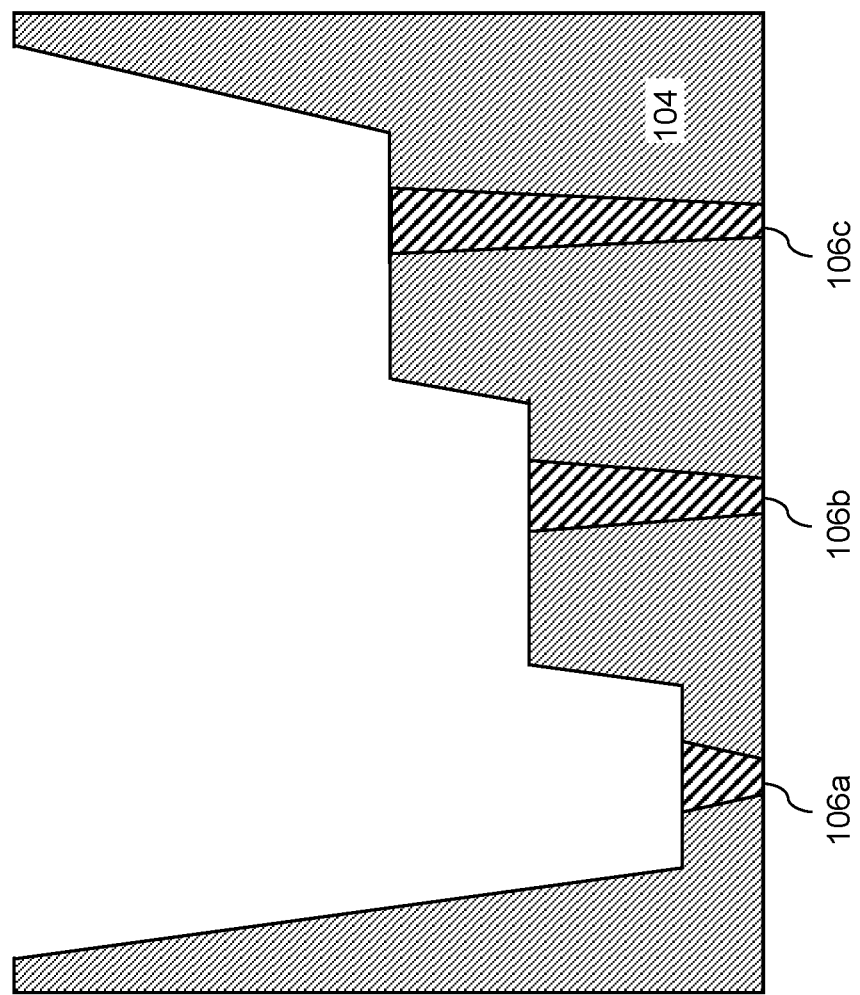
FIG. 1A is a vertical cross-sectional view of the exemplary structure after conductive contact vias 106a, 106b, 106c according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In overview, various embodiments are directed to semiconductor devices, and specifically to a semiconductor structure including two or more graduated capacitors and methods of forming the same. Various embodiment structures and methods may be used to reduce or eliminate adverse impacts of long manufacturing times. The various embodiment structures and methods may also be used to reduce and/or eliminate corrosion that occurs during these long etching processes, the various aspects of which are described herebelow.

Etching processes may be simultaneously time-sensitive and time-consuming, especially in semiconductor dies requiring a large array of devices including capacitors of various capacitance values. Etching processes may be time sensitive such that the formation of all required capacitances within a single die may require multiple deposition and etching steps, during which metals may be exposed to remnant etching gasses. Remnant etching gasses exposed to oxygen during the time-consuming etching processes may react to create moisture, which may create a metal surface crystal defect (i.e., corrosion). Moisture caused by remnant etching gasses may further be trapped under additional deposited layers, causing further defects to the semiconductor die.

A capacitor structure is disclosed within the present disclosure to reduce and/or eliminate corrosion caused by remnant etching gasses, in addition to standardizing and reducing manufacturing times. A capacitor structure may include a graduated, "step-like" structure including two or more bottom electrodes positioned at different depths from a shared top electrode within the capacitor structure. The bottom electrodes may be positioned within the capacitor structure such that the varying distances of each bottom electrode to the shared top electrode may create distinct capacitors having different capacitance values. The minimal steps to simultaneously layout each bottom electrode may reduce manufacturing times, and therefore reduce the total amount of corrosion experienced during the manufacturing process. Various embodiment capacitor structures and manufacturing methods may be customized to create multiple capacitors having different capacitance values for a variety of application and system requirements. The graduated capacitor structure may customize capacitance values by varying the distance between the bottom electrode and the shared top electrode, adjusting the depths of CMP processes (i.e., and therefore the distance of the top electrode to the graduated bottom electrodes), and by adjusting the thickness of the bottom electrode, among other structural design factors.

FIG. 1A is a vertical cross-sectional view of the exemplary structure 100 after formation of conductive contact vias 106a, 106b, 106c according to an embodiment of the present disclosure. Referring to FIG. 1A, one or more etch processes may be performed to shape the dielectric layer 104. The etch process may form the graduated, step-like, shape of the dielectric layer 104 as shown using any various deposition and etching techniques. The etch process may be performed to create a graduated trench shape, in which varying levels of horizontal planes may be formed between two sidewalls 102. The horizontal planes within the trench shape may be formed at heights less than the height of the top surface of the sidewalls 102. For ease of illustration, three graduated "steps" are shown as three horizontal planes having different heights within the structure 100, each horizontal plane having a via cavity. However, the structure 100 may include only two horizontal planes of varying heights, or may include any number of horizontal planes greater than two in which all horizontal planes are positioned at a height less than the height of the top surfaces of the sidewalls 102.

The etch process may form the shape of the dielectric layer 104 using an ion beam etch process. As another example, the dielectric layer 104 may be shaped by implementing a number of deposition and etching steps involving hard masks, such that the various depths of the via cavities (not shown) may be formed by depositing a hard mask layer (not shown), patterning the hard mask layer, etching the dielectric layer 104 at regions not covered by the hard mask layer, removing the hard mask layer, and repeating these steps to form a graduated shape of the dielectric layer 104. As another example, the graduated shape of the dielectric layer 104 may be formed by depositing and shaping dielectric material in multiple layers.

The etch process may include an anisotropic etch process or an isotropic etch process. In one embodiment, an anisotropic etch process such as a reactive ion etch process may be performed to transfer the pattern of a photoresist layer (not shown) through a mask layer. The photoresist layer may be subsequently removed, for example, by ashing. The etch process may comprise a reactive ion etch process that etches the dielectric layer 104 selective to the materials of an etch stop layer (not shown). In one embodiment, the dielectric layer 104 may include silicon oxide-based dielectric materials such as undoped silicate glass, a doped silicate glass, or organosilicate glass, and the anisotropic etch process may include a reactive ion etch process that etches the silicon oxide-based dielectric material selective to the dielectric materials of an etch stop layer and or any other etch mask layers. Other suitable dielectric materials are within the contemplated scope of disclosure.

A metallic fill material layer may be sequentially deposited in, and over, via cavities within the dielectric layer 104 to form metallic fill material portions. A metallic fill material layer (not shown) may include a metallic material that provides high electrical conductivity. For example, the metallic fill material layer may include an elemental metal or an intermetallic alloy of at least two elemental metals. In one embodiment, the metallic fill material layer may include tungsten (W), copper (Cu), ruthenium (Ru), molybdenum (Mo), aluminum (Al), aluminum copper (AlCu), aluminum silicon copper (AlSiCu), alloys thereof, and/or a layer stack thereof. Other suitable materials within the contemplated scope of disclosure may also be used. The metallic fill material layer may be deposited by any physical vapor deposition, chemical vapor deposition, electroplating, or electroless plating.

A chemical mechanical polishing/planarization (CMP) process may be performed to remove portions of the metallic fill material layer that overlie a horizontal plane including the top surface of the dielectric layer 104. Each remaining portion of the metallic fill material layer that fills a via cavity forms a conductive contact structure, or contact vias 106a, 106b, 106c. The top surfaces of the conductive contact vias 106a, 106b, 106c may be within the same horizontal plane as the top surfaces of the dielectric layer 104 for each graduated step within the structure 100. For example, as shown, the first conductive contact via 106a may have a top surface that is within the same horizontal plane as the top surface of the dielectric layer 104 within the leftmost "step," the second conductive contact via 106b may have a top surface that is within the same horizontal plane as the top surface of the dielectric layer 104 within the middle "step," and the third conductive contact via 106c may have a top surface that is within the same horizontal plane as the top surface of the dielectric layer 104 within the rightmost "step." Collectively, the first conductive contact via 106a, second conductive contact via 160b and third conductive contact via 106c may be referred to as conductive contact vias 106.

In some embodiments, the metallic fill material layer used to form each conductive contact via 106 may be deposited/disposed over a previously deposited via barrier layer (not shown). Each via barrier layer may be a patterned portion of the metallic barrier layer as deposited in a manner similar to the metallic fill material layer according to the processing steps of FIG. 1A. A via barrier layer may include an elemental metal or an intermetallic alloy of at least two elemental metals. In one embodiment, the via barrier layer may include titanium (Ti), tantalum (Ta), titanium nitride (TiN), tantalum nitride (TaN), W, alloys thereof, and/or a layer stack thereof. Other suitable materials within the contemplated scope of disclosure may also be used. The via barrier layer may be deposited by any physical vapor deposition, chemical vapor deposition, electroplating, or electroless plating.

Generally, the conductive contact vias 106 may be formed by depositing at least one conductive material in via cavities within the dielectric layer 104. Each conductive contact via 106 may be formed directly on a top surface of any respective semiconductor structure, such as a metal interconnect structure or a logic device structure or peripheral connection to a logic device structure used in logic devices, LED or LCD devices, RAM devices, CIS devices, and any other device in which more than one capacitance value may be used to implement said device.

In some embodiments, the structure 100 including dielectric layer 104 and contact vias 106 may be formed using at least two deposition and etching processes. The contact vias 106 may be formed piecewise within multiple sequentially deposited portions of the dielectric layer 104, such that portions of the dielectric layer 104 and portions of the contact vias 106 may be formed in sequence in multiple horizontal planes. For example, a lower, or first portion of the dielectric layer 104 may be formed, first sets of via cavities may be etched, and a metallic fill material layer may be deposited and polished to form the contact via 106a and first portions of the contact vias 106b, 106c. A second portion of the dielectric layer 104 may be deposited over top surfaces of the contact via 106a, first portions of the dielectric layer 104, and first portions of the contact vias 106b, 106c. Second sets of via cavities may be etched within the second portion of the dielectric layer 104 over the first portions of the contact vias 106b, 106c, and a metallic fill material layer may be deposited and polished to form the contact via 106b and second portions of the contact via 106c. A third portion of the dielectric layer 104 may be deposited over top surfaces of the contact vias 106a, 106b, second portions of the dielectric layer 104, and second portion of the contact via 106c. A via cavity may be etched within the third portion of the dielectric layer 104 over the second portion of the contact via 106c, and a metallic fill material layer may be deposited and polished to form the contact via 106c.

Figure 1B:
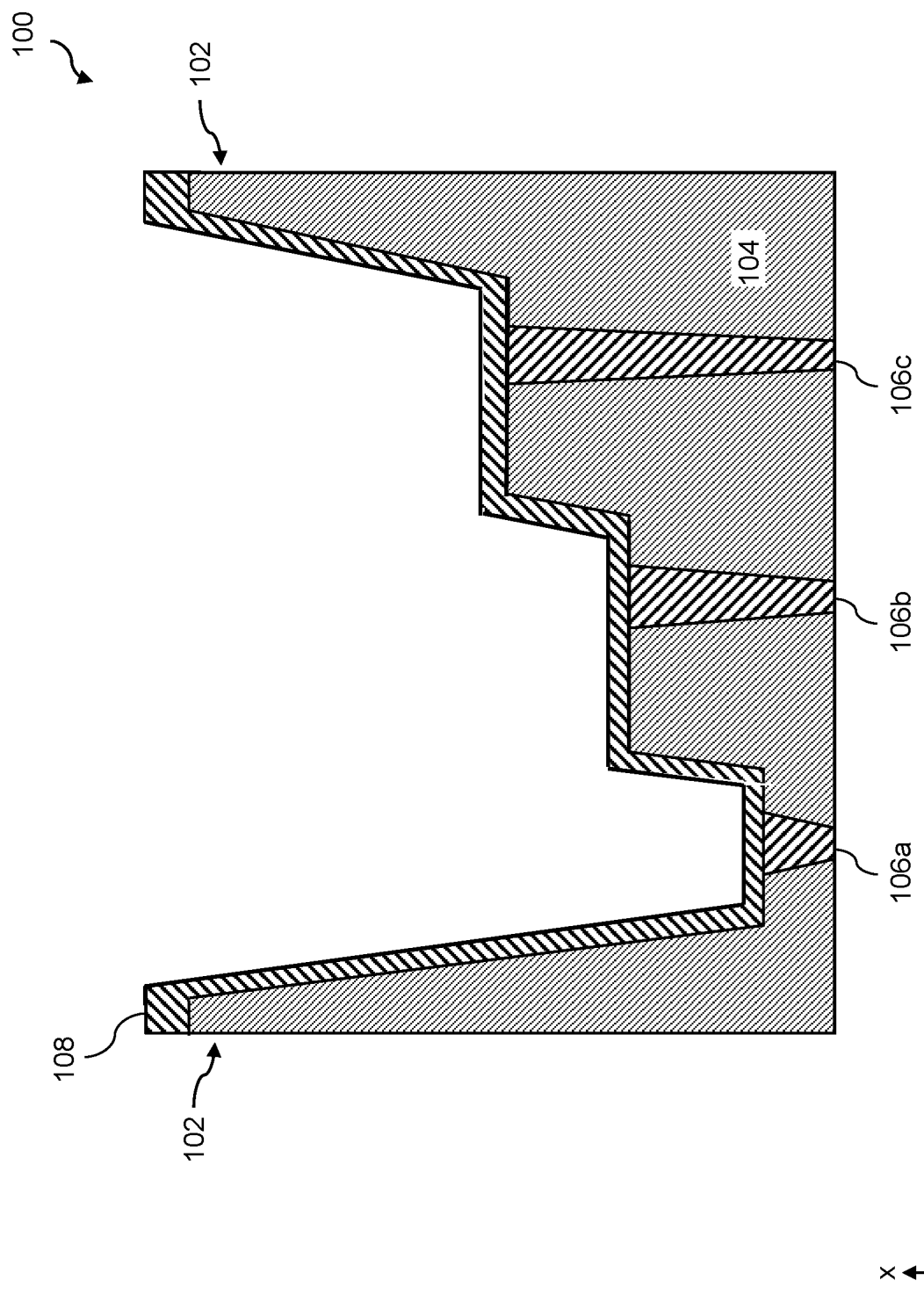
FIG. 1B is a vertical cross-sectional view of a region of the exemplary structure after deposition of a metallic barrier layer according to an embodiment of the present disclosure.

FIG. 1B is a vertical cross-sectional view of a region of the exemplary structure 100 after deposition of a metallic barrier layer 108 according to an embodiment of the present disclosure. Referring to FIG. 1B, the metallic barrier layer 108 may be sequentially deposited over each top surface of the conductive contact vias 106 and the top surfaces of the dielectric layer 104. The metallic barrier layer 108 may include an elemental metal or an intermetallic alloy of at least two elemental metals. In one embodiment, the metallic barrier layer 108 may include Ti, Ta, TiN, TaN, W, alloys thereof, and/or a layer stack thereof. Other suitable metallic barrier layer materials may be within the contemplated scope of disclosure. The metallic barrier layer 108 may be deposited by any physical vapor deposition, chemical vapor deposition, electroplating, or electroless plating. In one embodiment, the metallic barrier layer 108 may be deposited over top surfaces of the sidewalls 102.

Figure 1C:
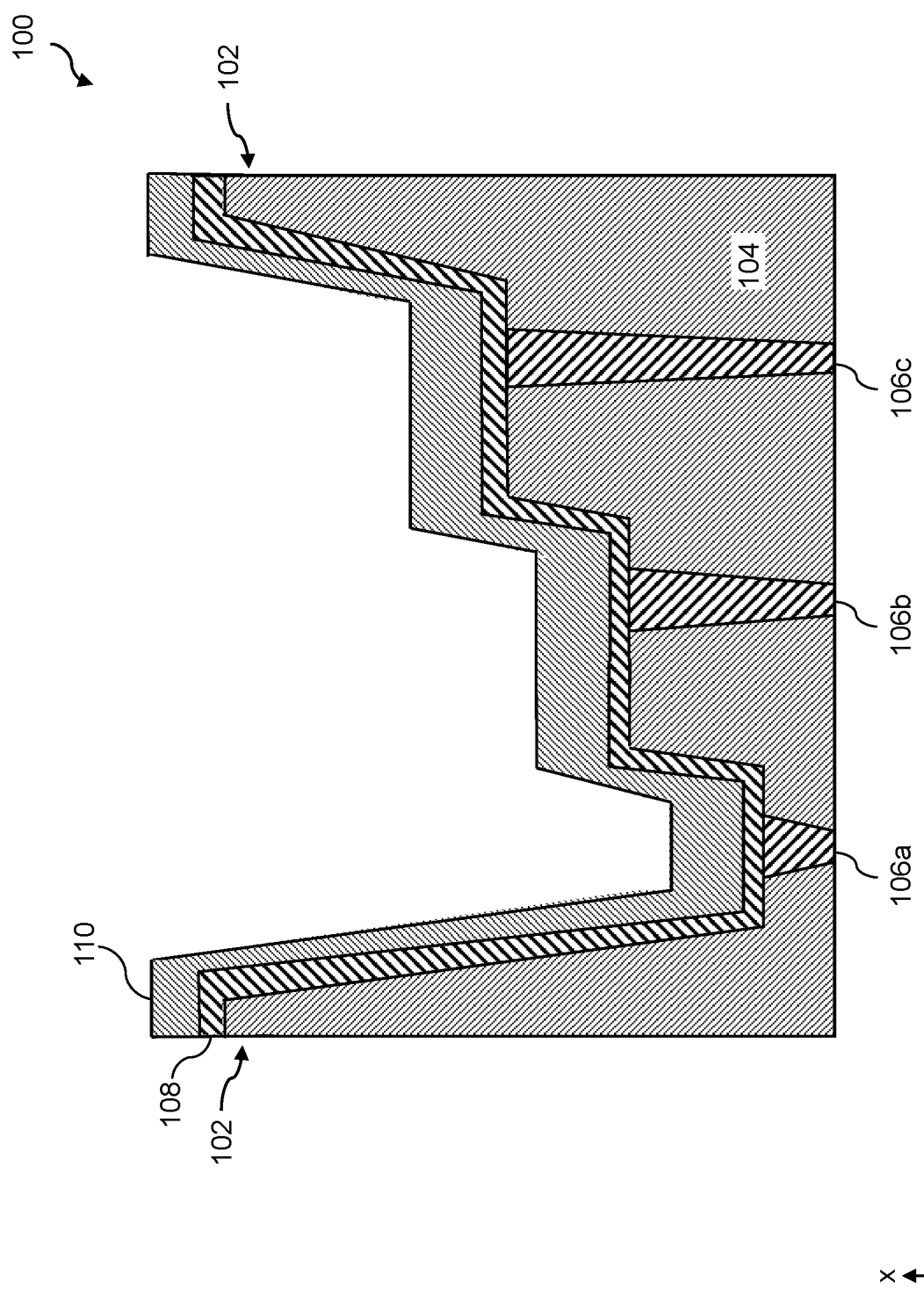
FIG. 1C is a vertical cross-sectional view of a region of the exemplary structure after deposition of a metallic capacitance layer according to an embodiment of the present disclosure.

FIG. 1C is a vertical cross-sectional view of a region of the exemplary structure 100 after deposition of a metallic capacitance layer 110 according to an embodiment of the present disclosure. Referring to FIG. 1C, the metallic capacitance layer 110 may be sequentially deposited over the top surface of metallic barrier layer 108. The metallic capacitance layer 110 may include an elemental metal or an intermetallic alloy of at least two elemental metals. In one embodiment, the metallic capacitance layer 110 may include W, Cu, Ru, Mo, Al, AlCu, AlSiCu, alloys thereof, and/or a layer stack thereof. Other suitable metallic capacitance layer materials may be within the contemplated scope of disclosure. The metallic capacitance layer 110 may be deposited by any physical vapor deposition, chemical vapor deposition, electroplating, or electroless plating. In one embodiment, the metallic capacitance layer 110 may be deposited above top surfaces of the sidewalls 102. In one embodiment, the metallic capacitance layer 110 may have a range of thicknesses, such as a thickness that is greater than or equal to 50 angstroms (A), although thicker or thinner metallic capacitance layer 110 may be used.

Figure 1D:
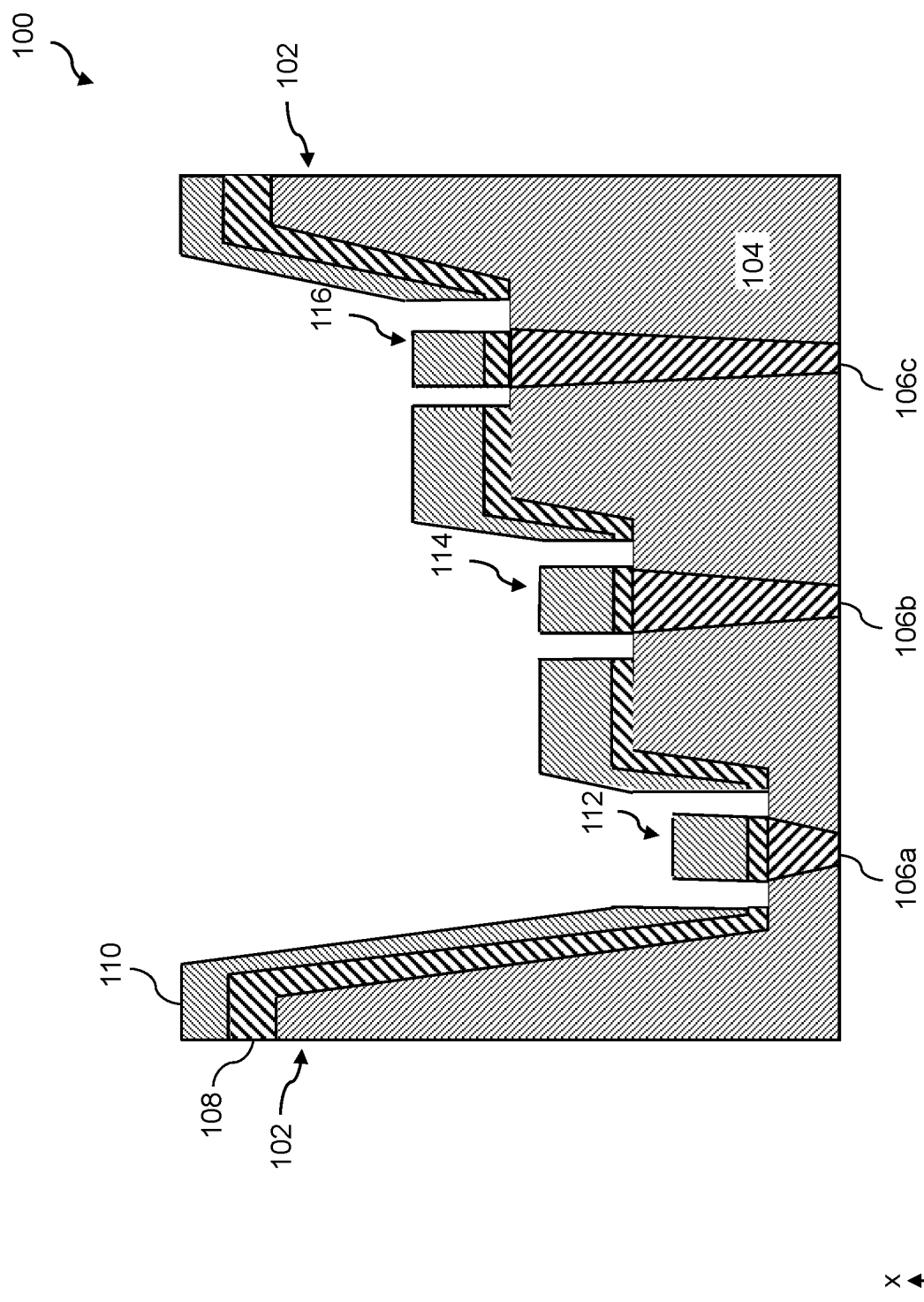
FIG. 1D is a vertical cross-sectional view of the exemplary structure after etching portions of the metallic capacitance layer according to an embodiment of the present disclosure.

FIG. 1D is a vertical cross-sectional view of the exemplary structure 100 after etching portions of the metallic capacitance layer 110 and metallic barrier layer 108 according to an embodiment of the present disclosure. Referring to FIG. 1D, a photoresist layer (not shown) may be applied over a mask layer (not shown), and may be lithographically patterned to form an array of openings in areas that are adjacent to top surfaces of the conductive contact vias 106. The periphery of each opening in the photoresist layer may be located outside the sidewall of the respective underlying conductive contact vias 106, or may coincide with the sidewall of the respective underlying conductive contact via 106 in a plan view, i.e., a view along a vertical direction (x).

The etch process may include an anisotropic etch process or an isotropic etch process. In one embodiment, an anisotropic etch process such as a reactive ion etch process may be performed to transfer the pattern of a photoresist layer (not shown) through a mask layer. The photoresist layer may be subsequently removed, for example, by ashing. The etch process may comprise a reactive ion etch process that etches the metallic capacitance layer 110 and metallic barrier layer 108 selective to the materials of an etch stop layer (not shown). In one embodiment, the metallic capacitance layer 110 and metallic barrier layer 108 may include various metals and/or alloys, and the anisotropic etch process may include a reactive ion etch process that etches the various metals and alloys of the metallic capacitance layer 110 and metallic barrier layer 108 selective to the dielectric materials of an etch stop layer and or any other etch mask layers. In one embodiment, the etch process may leave portions of the metallic capacitance layer 110 and metallic barrier layer 108 above the sidewalls 102 untouched using photoresist and mask layers.

The etch process may form trenches within the metallic capacitance layer 110 and metallic barrier layer 108 around the periphery of the top surface of the conductive contact vias 106, such that portions of the metallic capacitance layer 110 and metallic barrier layer 108 may be segregated as defined by the trenches. The segregated portions of the metallic capacitance layer 110 and metallic barrier layer 108 may each form respective bottom plates, or electrodes, of respective capacitors that will ultimately be formed within the structure 100. For example, as illustrated, three segregated portions of the metallic capacitance layer 110 and metallic barrier layer 108 may be formed over each respective conductive contact vias 106. The trenches created by the etch process may form first bottom electrode 112, second bottom electrode 114, and third bottom electrode 116. Each of the first bottom electrode 112, the second bottom electrode 114, and the third bottom electrode 116 may be electrically isolated from each other.

Figure 1E:
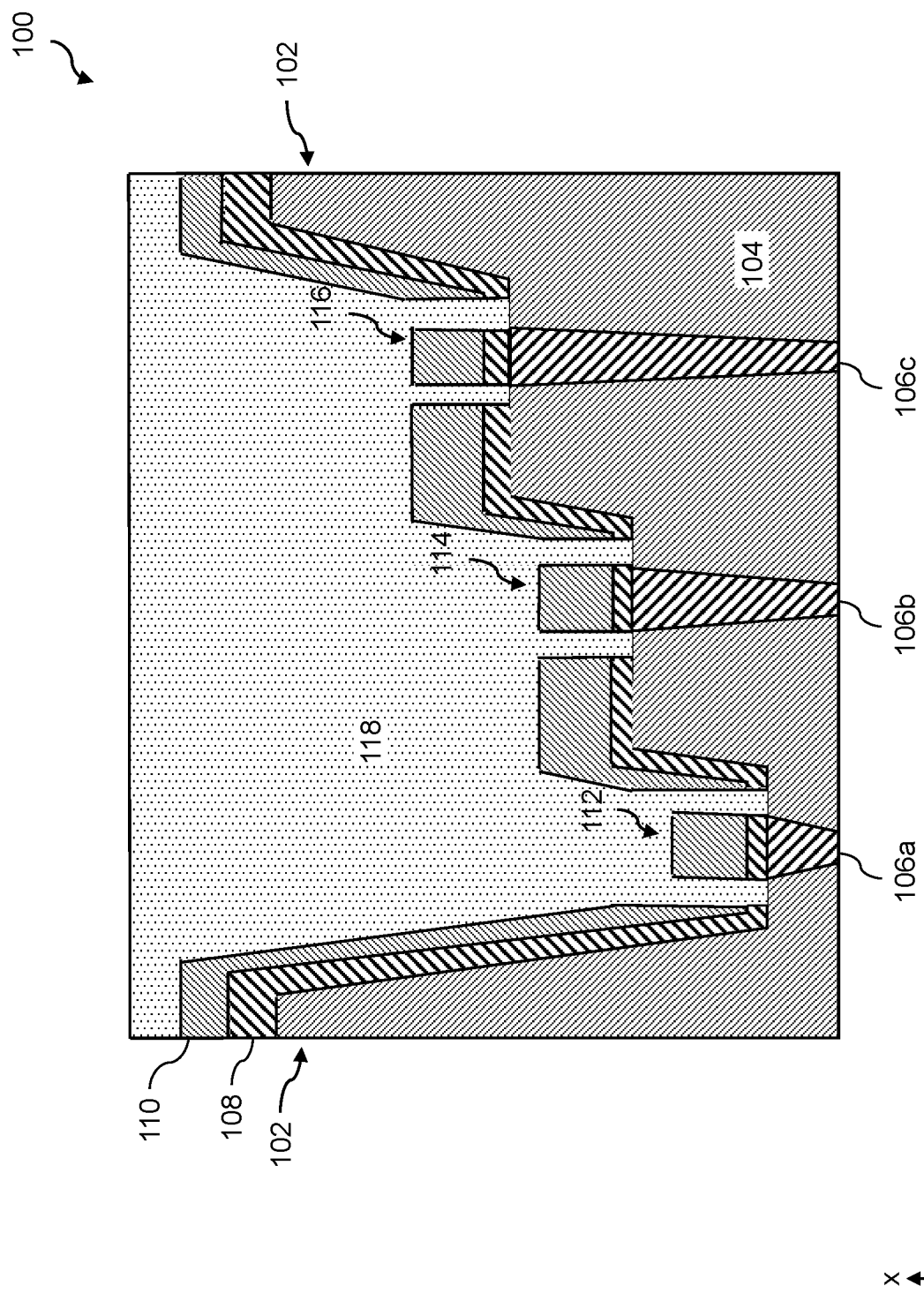
FIG. 1E is a vertical cross-sectional view of the exemplary structure after deposition of a second dielectric layer according to an embodiment of the present disclosure.

FIG. 1E is a vertical cross-sectional view of the exemplary structure 100 after deposition of a second dielectric layer 118 according to an embodiment of the present disclosure. Referring to FIG. 1E, the dielectric layer 118 may be sequentially deposited over the top surface of metallic capacitance layer 110. The dielectric layer 118 may fill in trenches formed during the etch process as described in FIG. 1D, such that the dielectric layer 118 may be in contact with sidewalls of the metallic capacitance layer 110 and the metallic barrier layer 108 and with exposed top surfaces of the dielectric layer 104 within the trenches. In one embodiment, the dielectric layer 118 may be deposited on a top surface of the metallic capacitance layer 110 above top surfaces of the sidewalls 102.

The dielectric layer 118 may include silicon oxide-based dielectric materials such as undoped silicate glass, a doped silicate glass, or organosilicate glass. In one embodiment, the dielectric layer 118 may include undoped silicon glass, silicon nitride, phosphosilicate glass, fluorosilicate glass, low-k material, extreme low-k material, and black diamond, and/or a layer stack thereof. Other suitable dielectric materials are within the contemplated scope of disclosure. The dielectric layer 118 may be implemented as an isolation layer between a top electrode (not shown) and each respective first bottom electrode 112, second bottom electrode 114, and third bottom electrode 116.

Figure 1F:
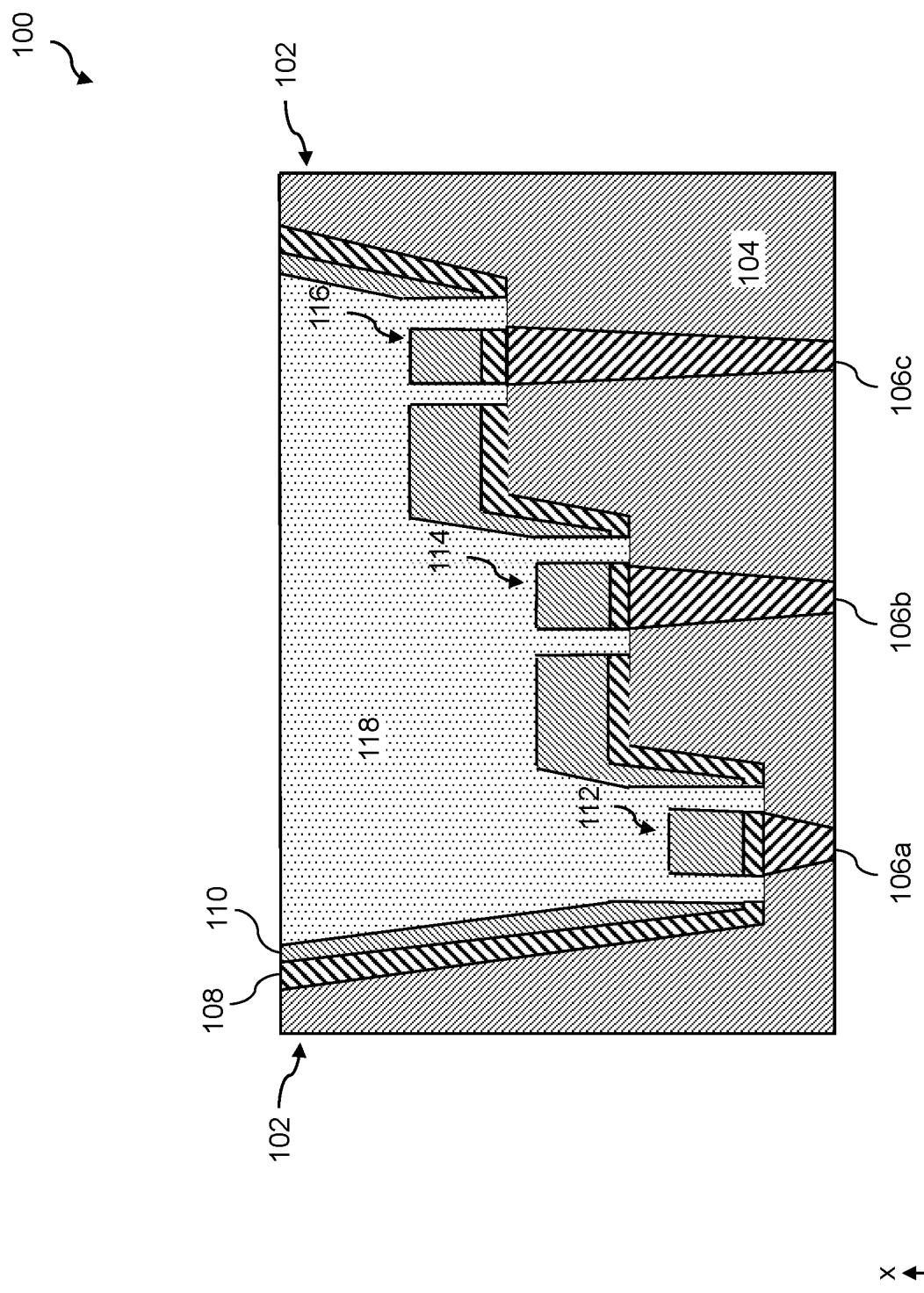
FIG. 1F is a vertical cross-sectional view of the exemplary structure after performing chemical mechanical polishing (CMP) according to an embodiment of the present disclosure.

FIG. 1F is a vertical cross-sectional view of the exemplary structure after performing CMP according to an embodiment of the present disclosure. Referring to FIG. 1F, a CMP process may remove portions of the metallic barrier layer 108, metallic capacitance layer 110, and dielectric layer 118. The CMP process may be performed to create a single horizontal plane in which top surfaces of the metallic barrier layer 108, metallic capacitance layer 110, the dielectric layer 118, and dielectric layer 104 may be exposed.

In one embodiment, the CMP process may be performed until a designated depth is reached, in which the designated depth is based on known depths of the first bottom electrode 112, the second bottom electrode 114, and the third bottom electrode 116 and known thicknesses of the metallic barrier layer 108, metallic capacitance layer 110, and dielectric layer 118. In one embodiment, the CMP process may be performed until a specific layer is detected by one or more sensors. For example, the CMP process may be performed, removing topmost portions of the metallic barrier layer 108, metallic capacitance layer 110, and the dielectric layer 118, until a topmost surface of the dielectric layer 104 is exposed (i.e., at the sidewalls 102).

Figure 1G:
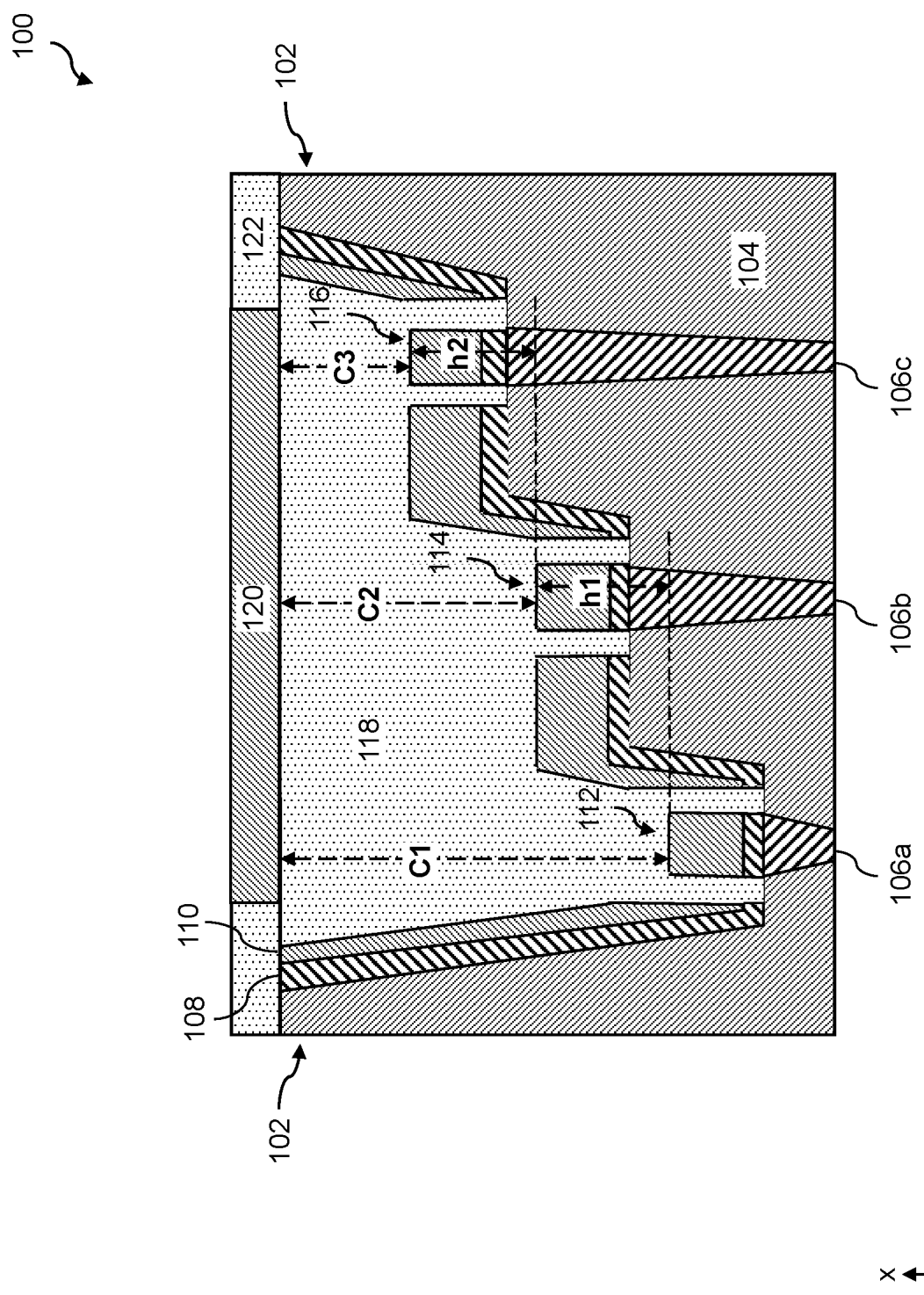
FIG. 1G is a vertical cross-sectional view of the exemplary structure after deposition of a top electrode according to an embodiment of the present disclosure.

FIG. 1G is a vertical cross-sectional view of the exemplary structure 100 after deposition of a top electrode 120 according to an embodiment of the present disclosure. Referring to FIG. 1G, a top electrode material layer may be deposited over the dielectric layer 118. The top electrode material layer may then be etched to form the top electrode 120. The sidewalls of the top electrode 120 may be at least respectively aligned with or extend past the outer periphery of the first bottom electrode 112 and the third bottom electrode 116, such that the top electrode 120 may be vertically positioned above each first bottom electrode 112, second bottom electrode 114, and third bottom electrode 116 between the sidewalls 102. The top electrode 120 may include an elemental metal or an intermetallic alloy of at least two elemental metals. In one embodiment, the top electrode 120 may include W, Cu, Ru, Mo, Al, AlCu, AlSiCu, alloys thereof, and/or a layer stack thereof. Other suitable metal materials are within the contemplated scope of disclosure. The top electrode 120 may be deposited by any one of physical vapor deposition, chemical vapor deposition, electroplating, or electroless plating. The top electrode 120 may be formed within a dielectric layer 122. In one embodiment, the top electrode 120 may be deposited, and then the dielectric layer 122 may be sequentially deposited around the top electrode 120. In an alternative embodiment, the dielectric layer 122 may be deposited, and then the top electrode 120 may be sequentially formed within the dielectric layer 122 using an etching process implementing photoresist layers and mask layers.

The top electrode 120 may create three distinct capacitors with the first bottom electrode 112, the second bottom electrode 114, and the third bottom electrode 116. A first capacitor may be defined by the top electrode 120 and the first bottom electrode 112, in which the capacitance value is determined by the first distance C1 between a top surface of the first bottom electrode 112 and a bottom surface of the top electrode 120. A second capacitor may be defined by the top electrode 120 and the second bottom electrode 114, in which the capacitance value is determined by the second distance C2 between a top surface of the second bottom electrode 114 and a bottom surface of the top electrode 120. A third capacitor may be defined by the top electrode 120 and the third bottom electrode 116, in which the capacitance value is determined by the third distance C3 between a top surface of the third bottom electrode 116 and a bottom surface of the top electrode 120. Thus, the first, second, and third capacitors may exhibit different capacitance values depending on the first distance C1, the second distance C2, and the third distance C3 between the top electrode 120 and the respective first bottom electrode 112, second bottom electrode 114, and third bottom electrode 116.

In one embodiment, circuitry and/or other logic devices (not shown) may be electrically connected to the contact vias 106, such that one or more of the first bottom electrode 112, the second bottom electrode 114, and the third bottom electrode 116 may be activated to temporarily create a capacitor with the top electrode 120. For example, logic devices connected to the contact vias 106 may apply a voltage to the contact via 106a, while applying no voltage to the contact vias 106b, 106c. Thus, the first bottom electrode 112 may be activated to create a capacitance between the first bottom electrode 112 and the top electrode 120 as defined by the first distance C1, while the second bottom electrode 114 and the third bottom electrode 116 remain inactive. As a further example, connected logic devices may deactivate the first bottom electrode 112 by eliminating the voltage applied to the first bottom electrode 112, and may activate the third bottom electrode 116 to create a capacitance between the third bottom electrode 116 and the top electrode 120 as defined by the third distance C3, while the first bottom electrode 112 and the second bottom electrode 114 remain inactive.

The first distance C1, the second distance C2, and the third distance C3 may be fine-tuned and controlled at least by (i) the depth of the CMP process as described by FIG. 1F, (ii) the depth and thickness of the metallic capacitance layer 110, (iii) the width of the first bottom electrode 112, the second bottom electrode 114, and the third bottom electrode 116 controlled by the etching process as described by FIG. 1D, and (iv) the material composition of the dielectric layer 118, among other structural design factors. Each capacitor may be fine-tuned and utilized for various functions within a semiconductor die depending on the required capacitance value for each application as determined by the aforementioned structural design factors.

In one embodiment, the thickness of the dielectric layer 118, acting as an isolation layer between capacitor electrodes (e.g., top electrode 120 and any one of first bottom electrode 112, second bottom electrode 114, and third bottom electrode 116), may be greater than or equal to 100 Å. For example, the thickness of the dielectric layer 118 between the third bottom electrode 116 and the top electrode 120 may be at least 100 Å, although thicker or thinner dielectric layer 118 may be used.

In one embodiment, the step height difference, or the difference in height between the top surface of one bottom electrode to the top surface of an adjacent bottom electrode, may be at least 20 Å. For example, a top surface of the first bottom electrode 112 may have a step height difference (h1) greater than 20 Å from the top surface of the second bottom electrode 114. As another example, a top surface of the second bottom electrode 114 may have a step height difference (h2) greater than 20 Å from the top surface of the third bottom electrode 116. Therefore, the top surface of the first bottom electrode 112 may have a step height difference (h1+h2) greater than 40 Å from the top surface of the third bottom electrode 116.

As previously described, for ease of illustration purposes, only three instances of capacitors of varying capacitance are shown. However, there may be only two capacitors between a single instance of sidewalls 102, or there may be any number of capacitors greater than two that are confined between the sidewalls 102.

Figure 2A:
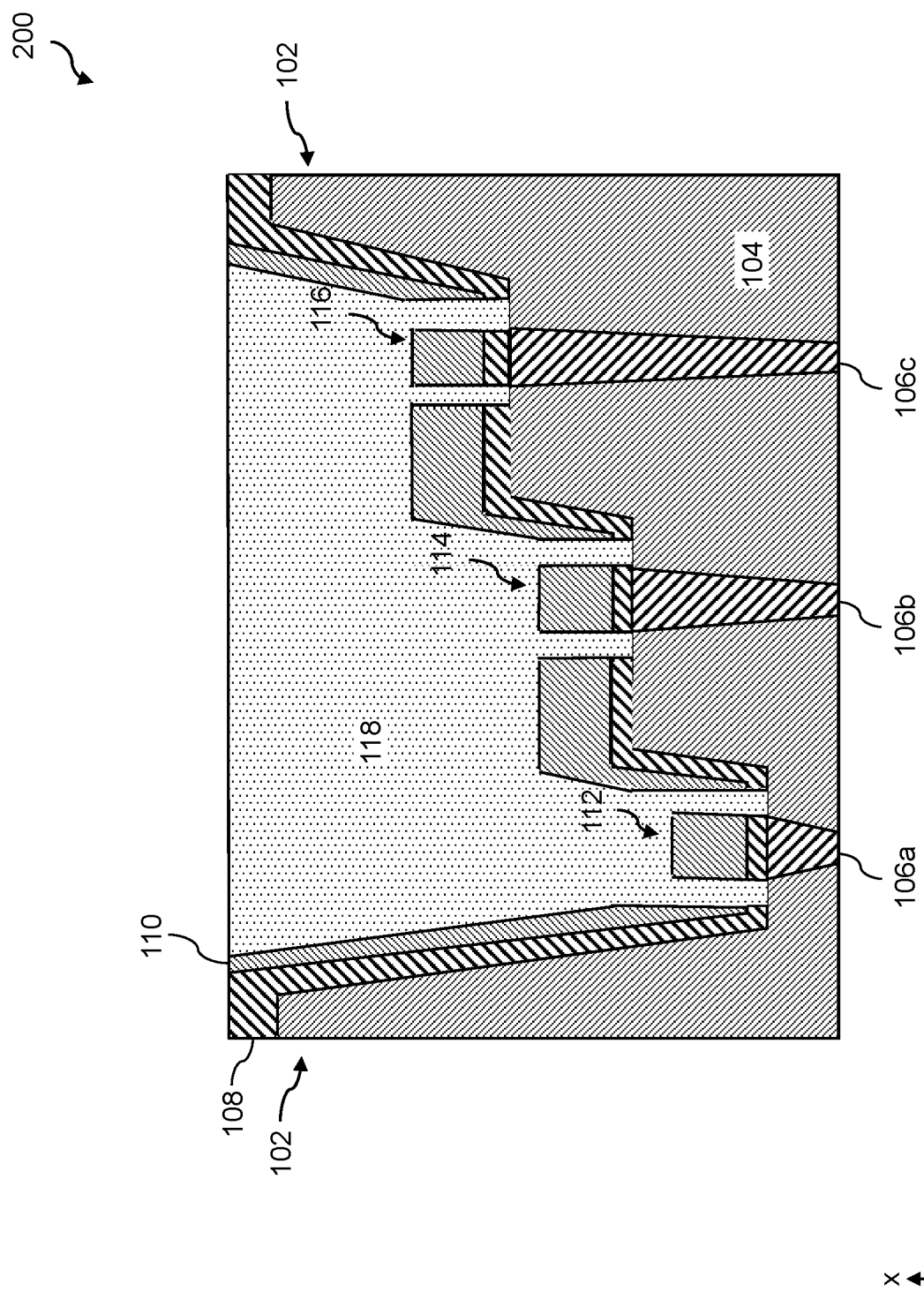
FIG. 2A is a vertical cross-sectional view of a first alternative embodiment of the exemplary structure after performing CMP until reaching the metallic barrier layer according to an embodiment of the present disclosure.
Figure 2B:
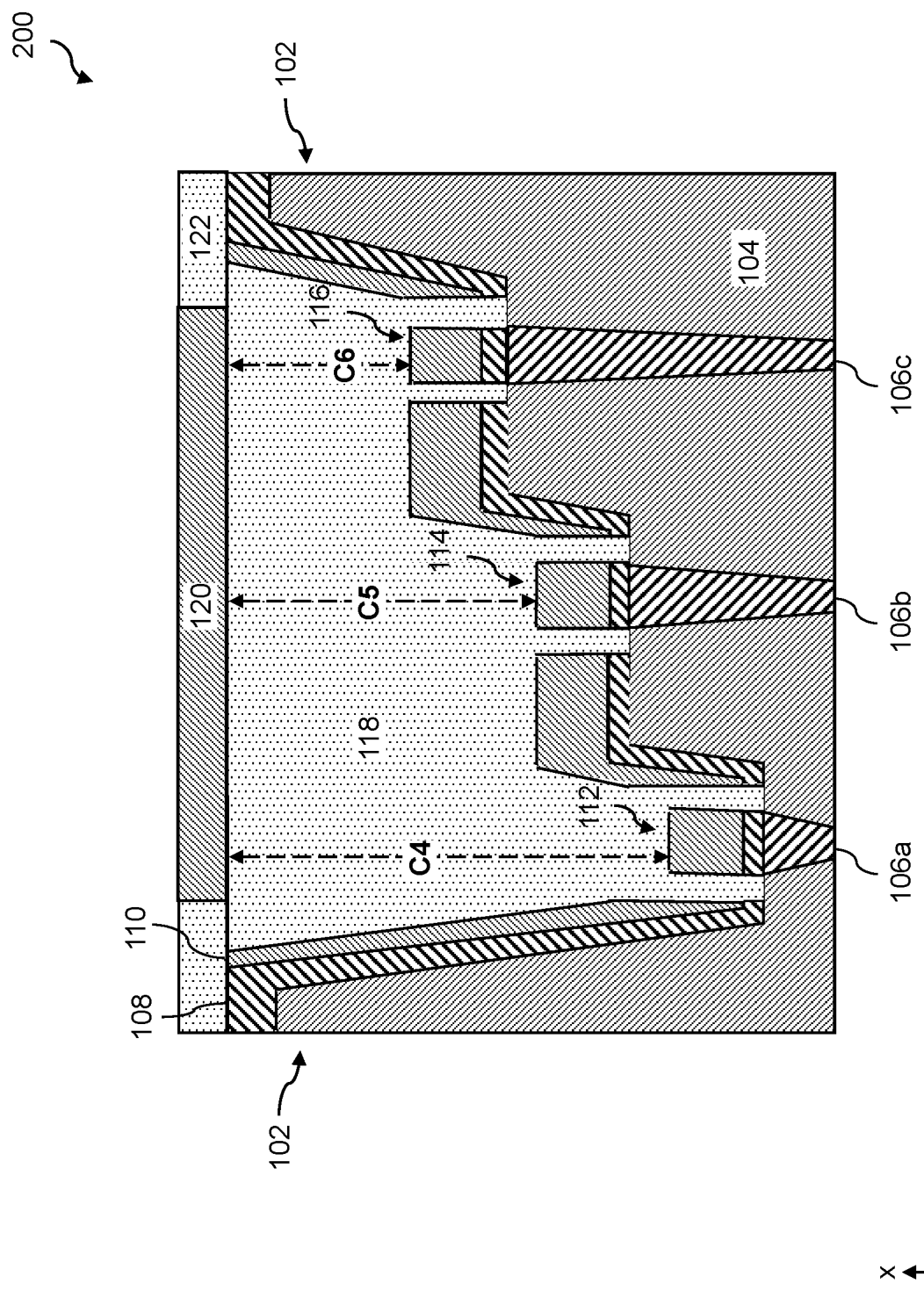
FIG. 2B is a vertical cross-sectional view of the first alternative embodiment of the exemplary structure after deposition of a top electrode according to an embodiment of the present disclosure.

FIGS. 2A and 2B are alternative embodiments that may be implemented in place of FIGS. 1F and 1G following the methods described in FIG. 1E. FIG. 2A is a vertical cross-sectional view of a first alternative embodiment of the exemplary structure 200 after performing CMP until reaching the metallic barrier layer 108 according to an embodiment of the present disclosure. Referring to FIG. 2A, a CMP process may remove portions of the metallic capacitance layer 110 and dielectric layer 118. Portions of the metallic capacitance layer 110 positioned above the sidewalls 102 may be removed during the CMP process. The CMP process may be performed to create a single horizontal plane in which top surfaces of the metallic barrier layer 108, metallic capacitance layer 110, and the dielectric layer 118 are exposed.

In one embodiment, the CMP process may be performed until a designated depth is reached, in which the designated depth is based on known depths of the first bottom electrode 112, the second bottom electrode 114, and the third bottom electrode 116 and known thicknesses of the metallic barrier layer 108, metallic capacitance layer 110, and dielectric layer 118. In one embodiment, the CMP process may be performed until a specific layer is detected by one or more sensors. For example, the CMP process may be performed, removing topmost portions of the metallic capacitance layer 110 and the dielectric layer 118, until a topmost surface of the metallic barrier layer 108 is exposed (i.e., above the sidewalls 102).

FIG. 2B is a vertical cross-sectional view of the first alternative embodiment of the exemplary structure 200 after deposition of a top electrode 120 according to an embodiment of the present disclosure. Referring to FIG. 2B, a top electrode material layer may be deposited over the dielectric layer 118. The top electrode material layer may then be etched to form the top electrode 120. The sidewalls of the top electrode 120 may be at least respectively aligned with or extend past the outer periphery of the first bottom electrode 112 and the third bottom electrode 116, such that the top electrode 120 may be vertically positioned above each bottom electrode between the sidewalls 102. The top electrode 120 may include an elemental metal or an intermetallic alloy of at least two elemental metals. In one embodiment, the top electrode 120 may include W, Cu, Ru, Mo, Al, AlCu, AlSiCu, alloys thereof, and/or a layer stack thereof. Other suitable metal materials are within the contemplated scope of disclosure. The top electrode 120 may be deposited by any one of physical vapor deposition, chemical vapor deposition, electroplating, or electroless plating. The top electrode 120 may be formed within a dielectric layer 122. In one embodiment, the top electrode 120 may be deposited, and then the dielectric layer 122 may be sequentially deposited around the top electrode 120. In an alternative embodiment, the dielectric layer 122 may be deposited, and then the top electrode 120 may be sequentially formed within the dielectric layer 122 using an etching process implementing photoresist layers and mask layers.

The top electrode 120 may create three distinct capacitors with the first bottom electrode 112, the second bottom electrode 114, and the third bottom electrode 116. A first capacitor may be defined by the top electrode 120 and the first bottom electrode 112, in which the capacitance value is determined by the distance C4 between a top surface of the first bottom electrode 112 and a bottom surface of the top electrode 120. A second capacitor may be defined by the top electrode 120 and the second bottom electrode 114, in which the capacitance value is determined by the distance C5 between a top surface of the second bottom electrode 114 and a bottom surface of the top electrode 120. A third capacitor may be defined by the top electrode 120 and the third bottom electrode 116, in which the capacitance value is determined by the distance C6 between a top surface of the third bottom electrode 116 and a bottom surface of the top electrode 120. Thus, the first capacitor, second capacitor, and third capacitor may each exhibit different capacitance values depending on the distance between the top electrode 120 and the first bottom electrode 112, the second bottom electrode 114, and the third bottom electrode 116.

The distances C4, C5, C6 may be fine-tuned and controlled at least by (i) the depth of the CMP process as described by FIG. 1F, (ii) the depth and thickness of the metallic capacitance layer 110, (iii) the width of the first bottom electrode 112, the second bottom electrode 114, and the third bottom electrode 116 controlled by the etching process as described by FIG. 1D, and (iv) the material composition of the dielectric layer 118, among other structural design factors. Each capacitor may be fine-tuned and utilized for various functions within a semiconductor die depending on the required capacitance for each application as determined by the aforementioned structural design factors.

In one embodiment, the thickness of the dielectric layer 118, acting as an isolation layer between capacitor electrodes, may be greater than or equal to 100 Å. For example, the thickness of the dielectric layer 118 between the third bottom electrode 116 and the top electrode 120 may be at least 100 Å.

Figure 3A:
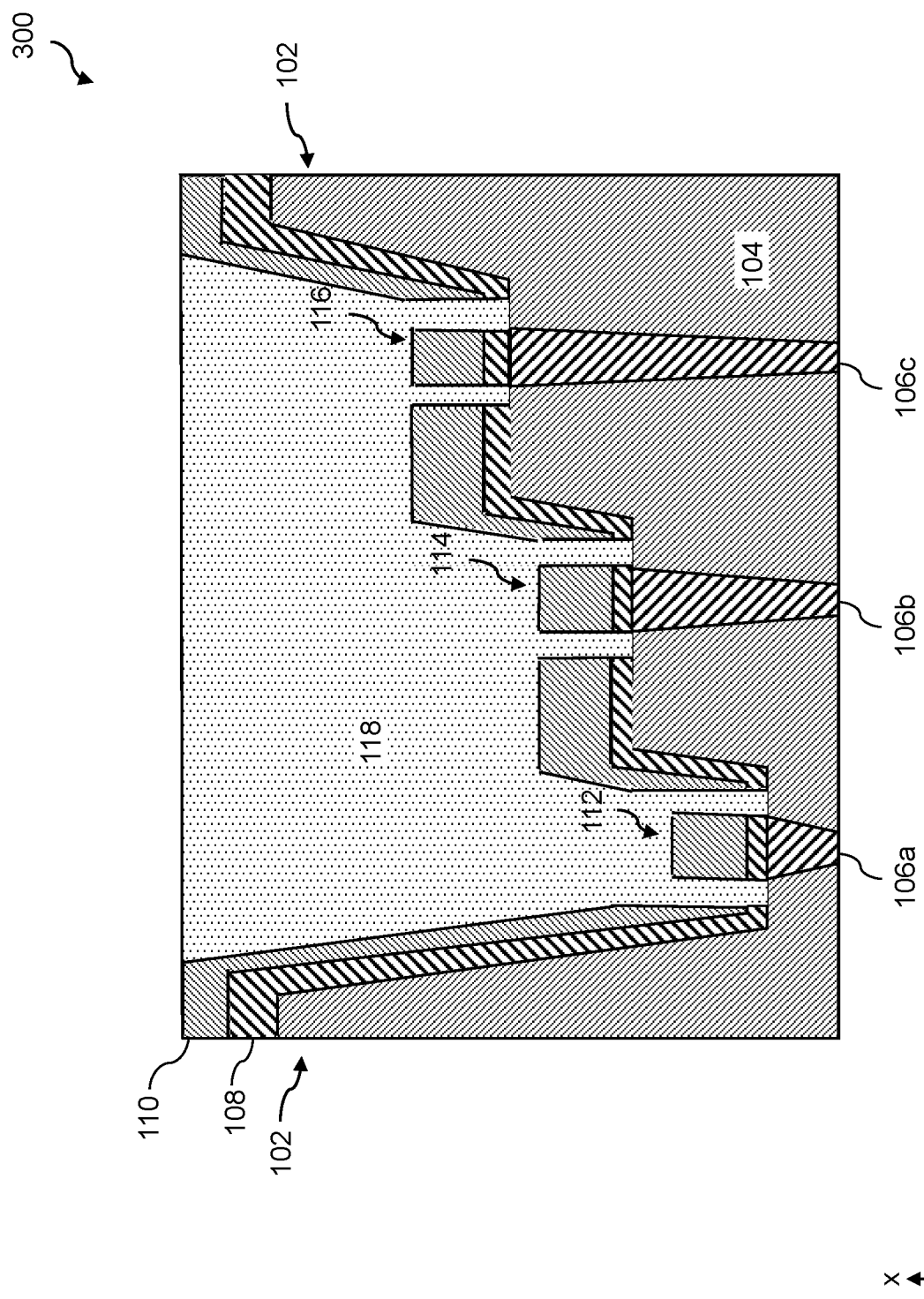
FIG. 3A is a vertical cross-sectional view of a second alternative embodiment of the exemplary structure after performing CMP until reaching the metallic capacitance layer according to an embodiment of the present disclosure.
Figure 3B:
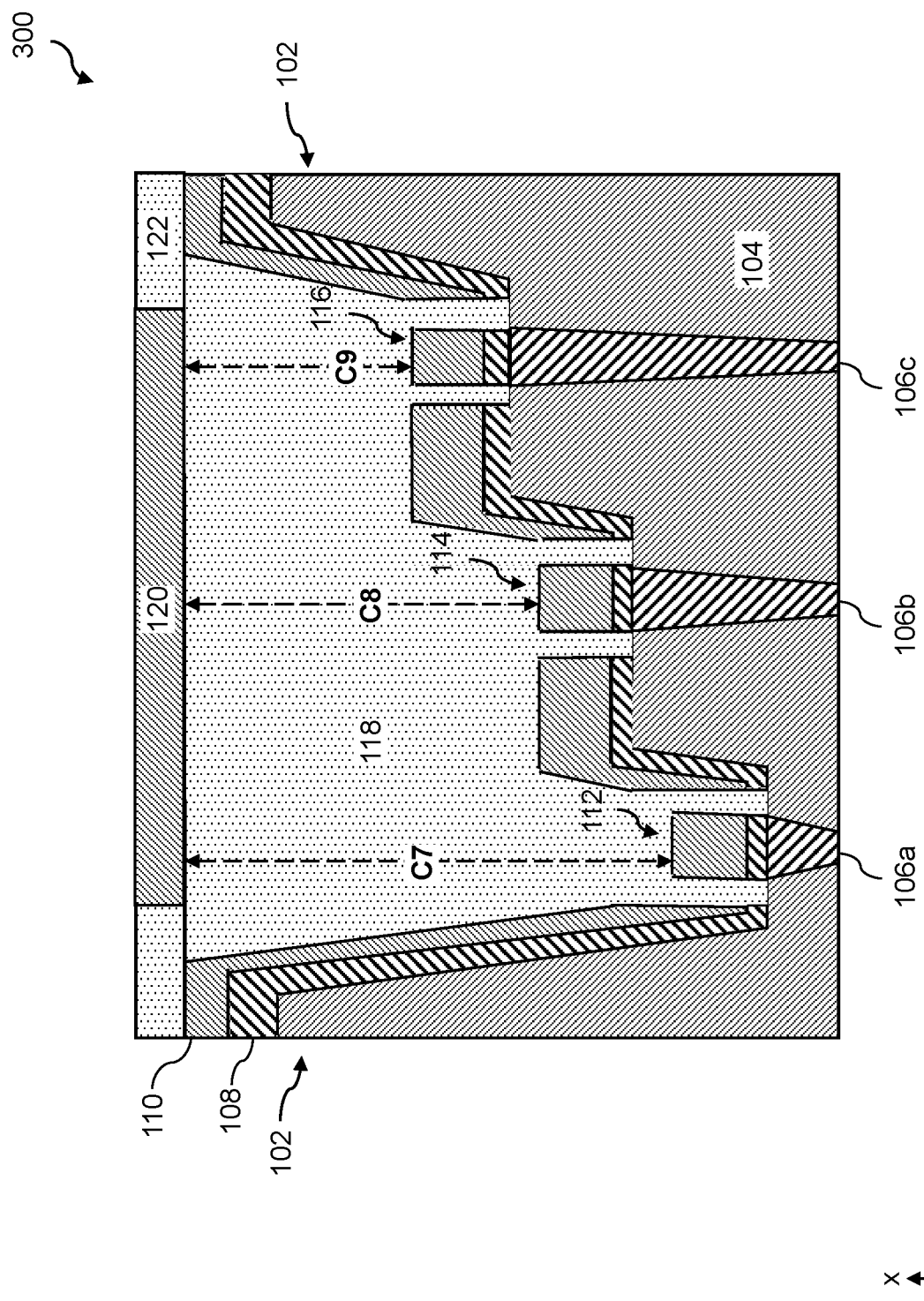
FIG. 3B is a vertical cross-sectional view of the second alternative embodiment of the exemplary structure after deposition of a top electrode according to an embodiment of the present disclosure.

FIGS. 3A and 3B are alternative embodiments that may be implemented in place of FIGS. 1F and 1G following the methods described in FIG. 1E. FIG. 3A is a vertical cross-sectional view of a second alternative embodiment of the exemplary structure 300 after performing CMP until reaching the metallic capacitance layer according to an embodiment of the present disclosure. Referring to FIG. 3A, a CMP process may remove portions of the dielectric layer 118. The CMP process may be performed to create a single horizontal plane in which top surfaces of the metallic capacitance layer 110 and the dielectric layer 118 are exposed.

In one embodiment, the CMP process may be performed until a designated depth is reached, in which the designated depth is based on known depths of the first bottom electrode 112, the second bottom electrode 114, and the third bottom electrode 116 and known thicknesses of the metallic barrier layer 108, metallic capacitance layer 110, and dielectric layer 118. In one embodiment, the CMP process may be performed until a specific layer is detected by one or more sensors. For example, the CMP process may be performed, removing topmost portions of the dielectric layer 118, until a topmost surface of the metallic capacitance layer 110 is exposed (i.e., above the sidewalls 102).

FIG. 3B is a vertical cross-sectional view of the second alternative embodiment of the exemplary structure 300 after deposition of a top electrode according to an embodiment of the present disclosure. Referring to FIG. 3B, the top electrode 120 may be deposited over the dielectric layer 118. The sidewalls of the top electrode 120 may be at least respectively aligned with or extend past the outer periphery of the first bottom electrode 112 and the third bottom electrode 116, such that the top electrode 120 may be vertically positioned above each bottom electrode between the sidewalls 102. The top electrode 120 may include an elemental metal or an intermetallic alloy of at least two elemental metals. In one embodiment, the top electrode 120 may include W, Cu, Ru, Mo, Al, AlCu, AlSiCu, alloys thereof, and/or a layer stack thereof. Other suitable metal materials are within the contemplated scope of disclosure. The top electrode 120 may be deposited by any one of physical vapor deposition, chemical vapor deposition, electroplating, or electroless plating. The top electrode 120 may be formed within a dielectric layer 122. In one embodiment, the top electrode 120 may be deposited, and then the dielectric layer 122 may be sequentially deposited around the top electrode 120. In an alternative embodiment, the dielectric layer 122 may be deposited, and then the top electrode 120 may be sequentially formed within the dielectric layer 122 using an etching process implementing photoresist layers and mask layers.

The top electrode 120 may create three distinct capacitors with the first bottom electrode 112, the second bottom electrode 114, and the third bottom electrode 116. A first capacitor may be defined by the top electrode 120 and the first bottom electrode 112, in which the capacitance value is determined by the distance C7 between a top surface of the first bottom electrode 112 and a bottom surface of the top electrode 120. A second capacitor may be defined by the top electrode 120 and the second bottom electrode 114, in which the capacitance value is determined by the distance C8 between a top surface of the second bottom electrode 114 and a bottom surface of the top electrode 120. A third capacitor may be defined by the top electrode 120 and the third bottom electrode 116, in which the capacitance value is determined by the distance C9 between a top surface of the third bottom electrode 116 and a bottom surface of the top electrode 120. Thus, the first capacitor, second capacitor, and third capacitor may each exhibit different capacitance values depending on the distance between the top electrode 120 and the first bottom electrode 112, the second bottom electrode 114, and the third bottom electrode 116.

The distances C7, C8, C9 may be fine-tuned and controlled at least by (i) the depth of the CMP process as described by FIG. 1F, (ii) the depth and thickness of the metallic capacitance layer 110, (iii) the width of the first bottom electrode 112, the second bottom electrode 114, and the third bottom electrode 116 controlled by the etching process as described by FIG. 1D, and (iv) the material composition of the dielectric layer 118, among other structural design factors. Each capacitor may be fine-tuned and utilized for various functions within a semiconductor die depending on the required capacitance for each application as determined by the aforementioned structural design factors.

In one embodiment, the thickness of the dielectric layer 118, acting as an isolation layer between capacitor electrodes, may be greater than or equal to 100 Å. For example, the thickness of the dielectric layer 118 between the third bottom electrode 116 and the top electrode 120 may be at least 100 Å.

Figure 4A:
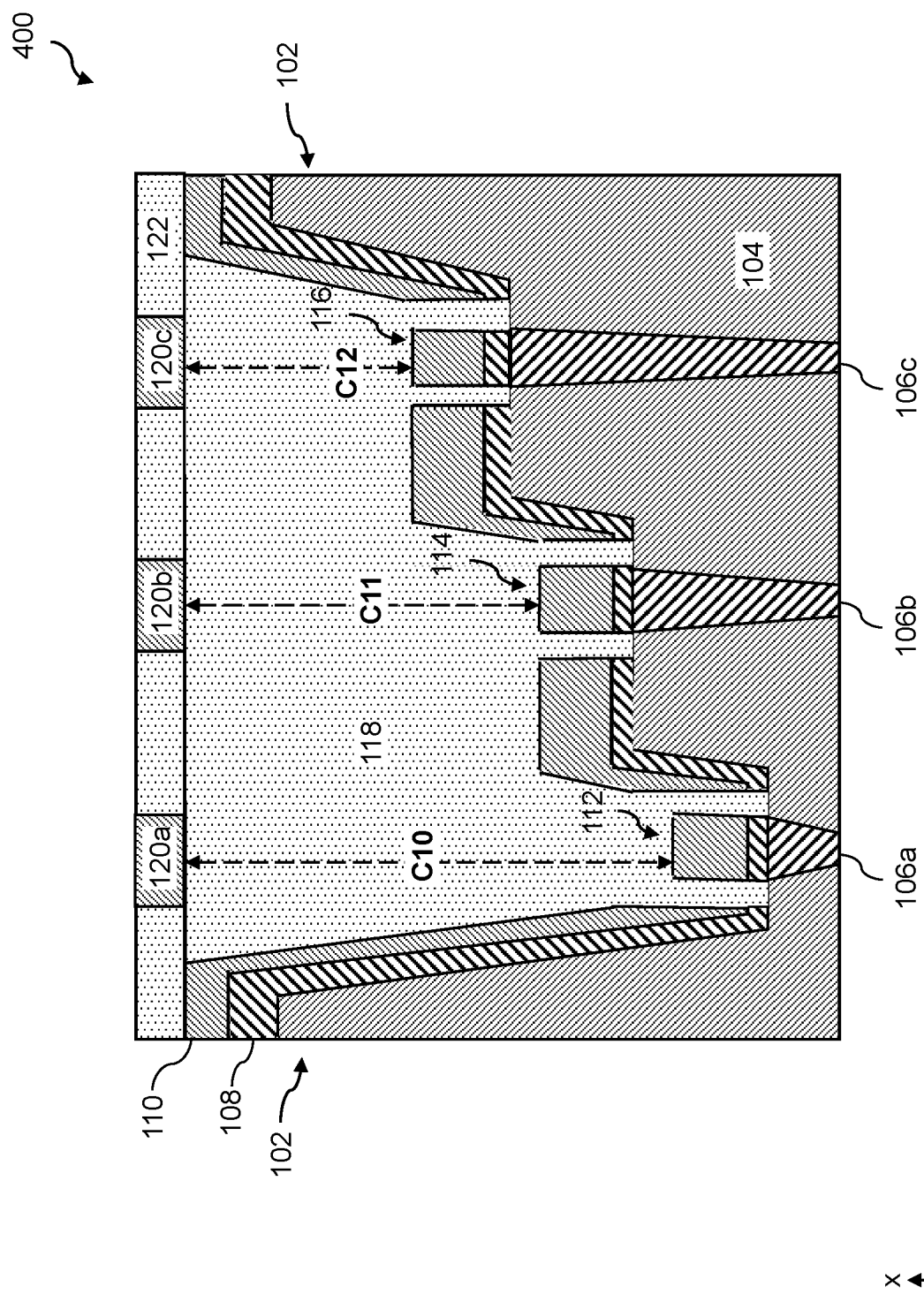
FIG. 4A is a vertical cross-sectional view of the third alternative embodiment of the exemplary structure after deposition of a top electrode material layer according to an embodiment of the present disclosure.

FIG. 4A is a vertical cross-sectional view of the third alternative embodiment of the exemplary structure 400 after deposition of a top electrode material layer according to an embodiment of the present disclosure. Referring to FIG. 4A, a top electrode material layer may be deposited over the dielectric layer 118. The top electrode material layer may be patterned to form a first top electrode 120a, a second top electrode 120b, and a third top electrode 120c. The sidewalls of each of the first top electrode 120a, the second top electrode 120b, and the third top electrode 120c may be at least respectively aligned with or extend past the outer periphery of the first bottom electrode 112, the second bottom electrode 114, and the third bottom electrode 116. For example, the first top electrode 120a may be vertically positioned above the first bottom electrode 112, the second top electrode 120b may be vertically positioned above the second bottom electrode 114, and the third top electrode 120c may be vertically positioned above the third bottom electrode 116. The first top electrode 120a, the second top electrode 120b, and the third top electrode 120c may include an elemental metal or an intermetallic alloy of at least two elemental metals. In one embodiment, the first top electrode 120a, the second top electrode 120b, and the third top electrode 120c may include W, Cu, Ru, Mo, Al, AlCu, AlSiCu, alloys thereof, and/or a layer stack thereof. Other suitable metal materials are within the contemplated scope of disclosure. The top electrode material layer may be deposited by any one of physical vapor deposition, chemical vapor deposition, electroplating, or electroless plating. The first top electrode 120a, the second top electrode 120b, and the third top electrode 120c may be formed within a dielectric layer 122. In one embodiment, the first top electrode 120a, the second top electrode 120b, and the third top electrode 120c may be formed, and then the dielectric layer 122 may be sequentially deposited around the first top electrode 120a, the second top electrode 120b, and the third top electrode 120c. In an alternative embodiment, the dielectric layer 122 may be deposited, and then the first top electrode 120a, the second top electrode 120b, and the third top electrode 120c may be sequentially formed within the dielectric layer 122 using a pattern and etching process using photoresist layers and mask layers.

The first top electrode 120a, the second top electrode 120b, and the third top electrode 120c may create three distinct capacitors respectively with the first bottom electrode 112, the second bottom electrode 114, and the third bottom electrode 116. A first capacitor may be defined by the first top electrode 120a and the first bottom electrode 112, in which the capacitance value is determined by the distance C10 between a top surface of the first bottom electrode 112 and a bottom surface of the first top electrode 120a. A second capacitor may be defined by the second top electrode 120b and the second bottom electrode 114, in which the capacitance value is determined by the distance C11 between a top surface of the second bottom electrode 114 and a bottom surface of the second top electrode 120b. A third capacitor may be defined by the third top electrode 120c and the third bottom electrode 116, in which the capacitance value is determined by the distance C12 between a top surface of the third bottom electrode 116 and a bottom surface of the third top electrode 120c. Thus, the first capacitor, second capacitor, and third capacitor may each exhibit different capacitance values depending on the distances between the first top electrode 120a, the second top electrode 120b, and the third top electrode 120c and the first bottom electrode 112, the second bottom electrode 114, and the third bottom electrode 116.

The distances C10, C11, C12 may be fine-tuned and controlled at least by (i) the depth of the CMP process as described by FIG. 1F, (ii) the depth and thickness of the metallic capacitance layer 110, (iii) the width of the first bottom electrode 112, the second bottom electrode 114, and the third bottom electrode 116 controlled by the etching process as described by FIG. 1D, and (iv) the material composition of the dielectric layer 118, among other structural design factors. Each capacitor may be fine-tuned and utilized for various functions within a semiconductor die depending on the required capacitance for each application as determined by the aforementioned structural design factors.

In one embodiment, the thickness of the dielectric layer 118, acting as an isolation layer between capacitor electrodes, may be greater than or equal to 100 Å. For example, the thickness of the dielectric layer 118 between the third bottom electrode 116 and the third top electrode 120c may be at least 100 Å.

Figure 4B:
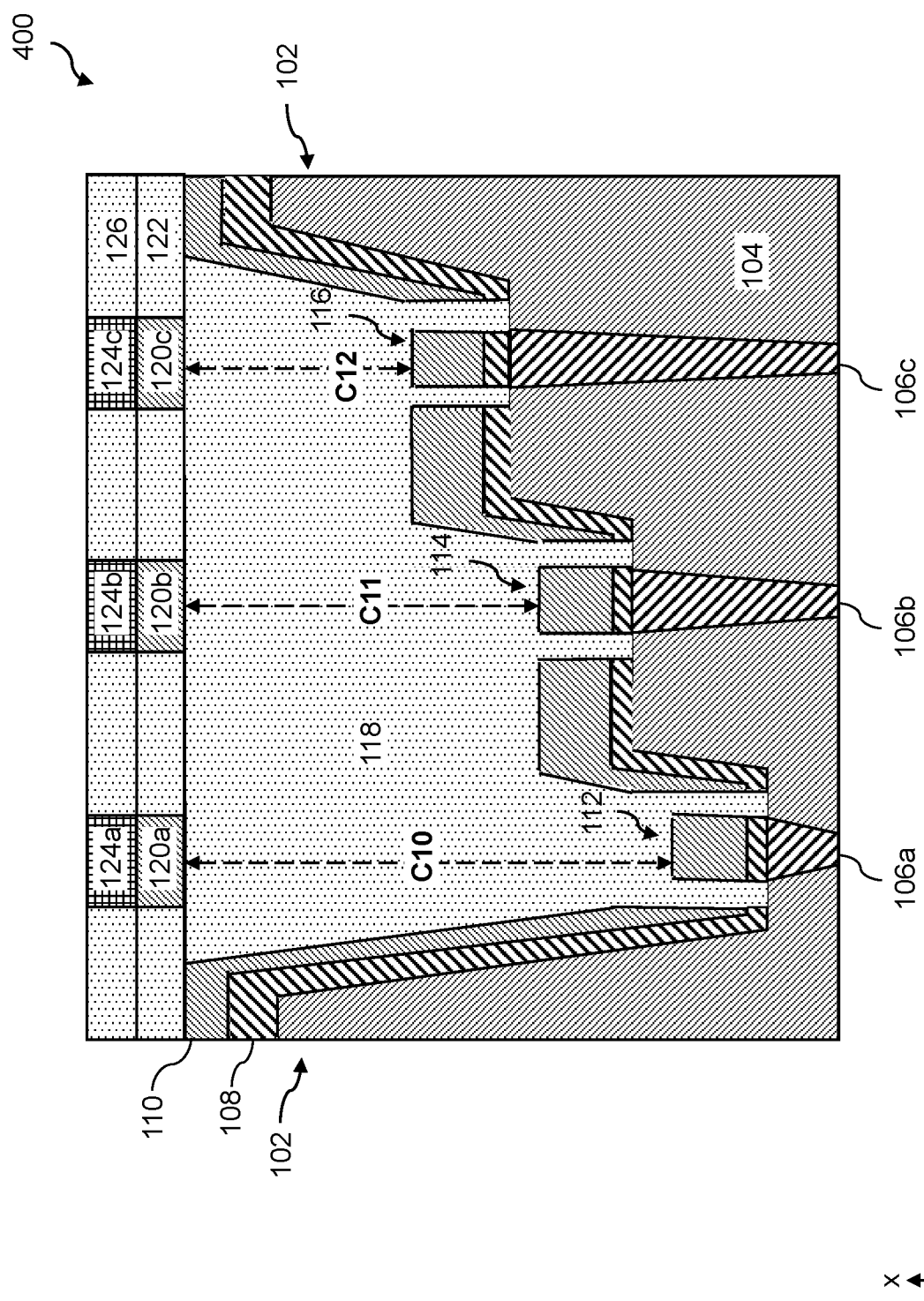
FIG. 4B is a vertical cross-sectional view of the third alternative embodiment of the exemplary structure after deposition of an organic light-emitting diode (OLED) material layer according to an embodiment of the present disclosure.

FIG. 4B is a vertical cross-sectional view of the third alternative embodiment of the exemplary structure 400 after deposition of an organic light-emitting diode (OLED) material layer according to an embodiment of the present disclosure. Referring to FIG. 4B, an OLED material layer may be deposited over the first top electrode 120a, the second top electrode 120b, and the third top electrode 120c. The OLED material layer me be patterned to form a first OLED layer 124a, a second OLED layer 124b, and a third OLED layer 124c. The sidewalls of each of the first OLED layer 124a, the second OLED layer 124b, and the third OLED layer 124c may be at least respectively aligned with or extend past the outer periphery of the first top electrode 120a, the second top electrode 120b, and the third top electrode 120c. For example, the first OLED layer 124a may be vertically positioned above the first top electrode 120a, the second OLED layer 124b may be vertically positioned above the second top electrode 120b, and the third OLED layer 124c may be vertically positioned above the third top electrode 120c. The OLED material layer may be deposited by any one of physical vapor deposition, chemical vapor deposition, electroplating, or electroless plating. The first OLED layer 124a, the second OLED layer 124b, and the third OLED layer 124c may be formed within a dielectric layer 126. In one embodiment, the first OLED layer 124a, the second OLED layer 124b, and the third OLED layer 124c may be formed, and then the dielectric layer 126 may be sequentially deposited around the first OLED layer 124a, the second OLED layer 124b, and the third OLED layer 124c. In an alternative embodiment, the dielectric layer 126 may be deposited, and then the first OLED layer 124a, the second OLED layer 124b, and the third OLED layer 124c may be sequentially formed within the dielectric layer 126 using an etching process implementing photoresist layers and mask layers.

The first OLED layer 124a, second OLED layer 124b, and third OLED layer 124c may be connected to additional structures and circuitry (not shown) to improve capacitor performance in various optical devices. For example, the structure 400 may be electrically connected to additional structures and circuitry to finetune capacitance values and increase optical performance consistency (i.e., by reducing risk of or eliminating metal corrosion during the manufacturing process) within an OLED device.

Figure 5:
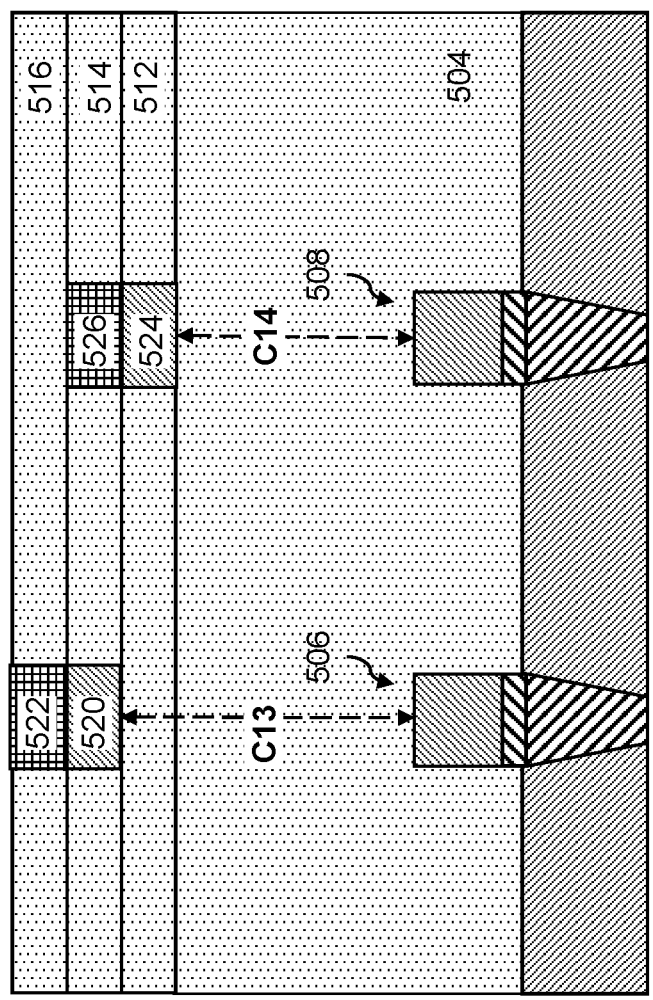
FIG. 5 is a vertical cross-sectional view of a structure containing OLED material.

Various embodiments allow for the fine-tuning of capacitance values and improvement of optical performance within OLED applications. FIG. 5 is a vertical cross-sectional view of a structure 500 containing OLED material. The structure 500 may contain OLED layers used in combination with additional OLED circuitry (not shown) to form an OLED device. Referring to FIG. 5, capacitors may be formed using top electrodes and bottom electrodes. A first capacitor with a capacitance value defined by the distance C13 may be formed using a bottom electrode 506 and a top electrode 520. A second capacitor with a capacitance value defined by the distance C14 may be formed using a bottom electrode 508 and a top electrode 524.

An OLED layer 522 and an OLED layer 526 may be formed on top of the top electrodes 520, 524 respectively. The top electrodes 520, 524 may be staggered with respect to the bottom electrodes 506, 508, which may be positioned in a same horizontal plane. The top electrodes 520, 524 may be staggered throughout dielectric layers 512, 514 to create varying distances C13 and C14. The bottom electrodes 506, 508 may be separated from the top electrodes 520, 524 at least by a capacitance isolation layer 504. The dielectric layers 512, 514, the capacitance isolation layer 504, and the top electrodes 520, 524 may be transparent, such that the OLED layer 522 and the OLED layer 526 may reflect light through the dielectric layers 512, 514, the capacitance isolation layer 504, and the top electrodes 520, 524.

The manufacturing process to form the staggered OLED layer structure may be time consuming and may suffer from metal corrosion during etching phases. For example, the dielectric layers 512, 514 must be etched during different etching processes to form the staggered positioning of the top electrodes 520, 524. The long etching processes may cause the metal of the top electrodes 520, 524 to be exposed to remnant etching gas for long periods. The long exposure to remnant etching gas may cause the top electrodes 520, 524 to corrode significantly. Corrosion may reduce the reflectivity of the top electrodes 520, 524, therefore effecting the efficiency of the OLEDs layers 522, 526 and the overall optical performance of the structure 500 within various OLED devices.

Various embodiments as described with reference to FIGS. 1-4B, 6, and 7 may reduce and/or resolve the corrosion issues experienced by the OLED layer structure 500. For example, as described with reference to FIG. 4B, the first bottom electrode 112, the second bottom electrode 114, and the third bottom electrode 116 may be staggered with respect to each other and positioned on different horizontal planes, the first OLED 124a, the second OLED 124b, and the third OLED 124c may be in a same horizontal plane, and the first top electrode 120a, the second top electrode 120b, and the third top electrode 120c may be in a same horizontal plane. The first bottom electrode 112, the second bottom electrode 114, and the third bottom electrode 116 may be etched and the dielectric layer 118 may be deposited. The dielectric layer 118, functioning as a transparent capacitance isolation layer, may protect the first bottom electrode 112, the second bottom electrode 114, and the third bottom electrode 116 from corrosion during any subsequent etching processes. The dielectric layer 118 may be directly capped with the first top electrode 120a, the second top electrode 120b, and the third top electrode 120c. Directly capping the dielectric layer 118 with the first top electrode 120a, the second top electrode 120b, and the third top electrode 120c may reduce the number of etching processes required to form varying capacitance values, since the varying distances C10, C11, and C12 may be created by previously staggering the first bottom electrode 112, the second bottom electrode 114, and the third bottom electrode 116. As compared to the OLED layer structure 500 as described with reference to FIG. 5, the exemplary structure 400 may be formed using fewer etching processes with respect to the formation of the first top electrode 120a, the second top electrode 120b, and the third top electrode 120c. The structure 400 may allow for finetuning of capacitance values with fewer manufacturing steps by embedding and staggering the first bottom electrode 112, the second bottom electrode 114, and the third bottom electrode 116 within the dielectric layer 118. The minimization of etching processes may reduce the exposure of the first bottom electrode 112, the second bottom electrode 114, and the third bottom electrode 116 to remnant etching gasses, and therefore reduce the opportunity for the first bottom electrode 112, the second bottom electrode 114, and the third bottom electrode 116 to corrode during the manufacturing process. Reflectivity of the first bottom electrode 112, the second bottom electrode 114, and the third bottom electrode 116 may be preserved and may be more consistently uniform through the reduction and/or elimination of electrode corrosion, therefore improving optical performance of the first OLED 124a, the second OLED 124b, and the third OLED 124c in the structure 400.

Figure 6:
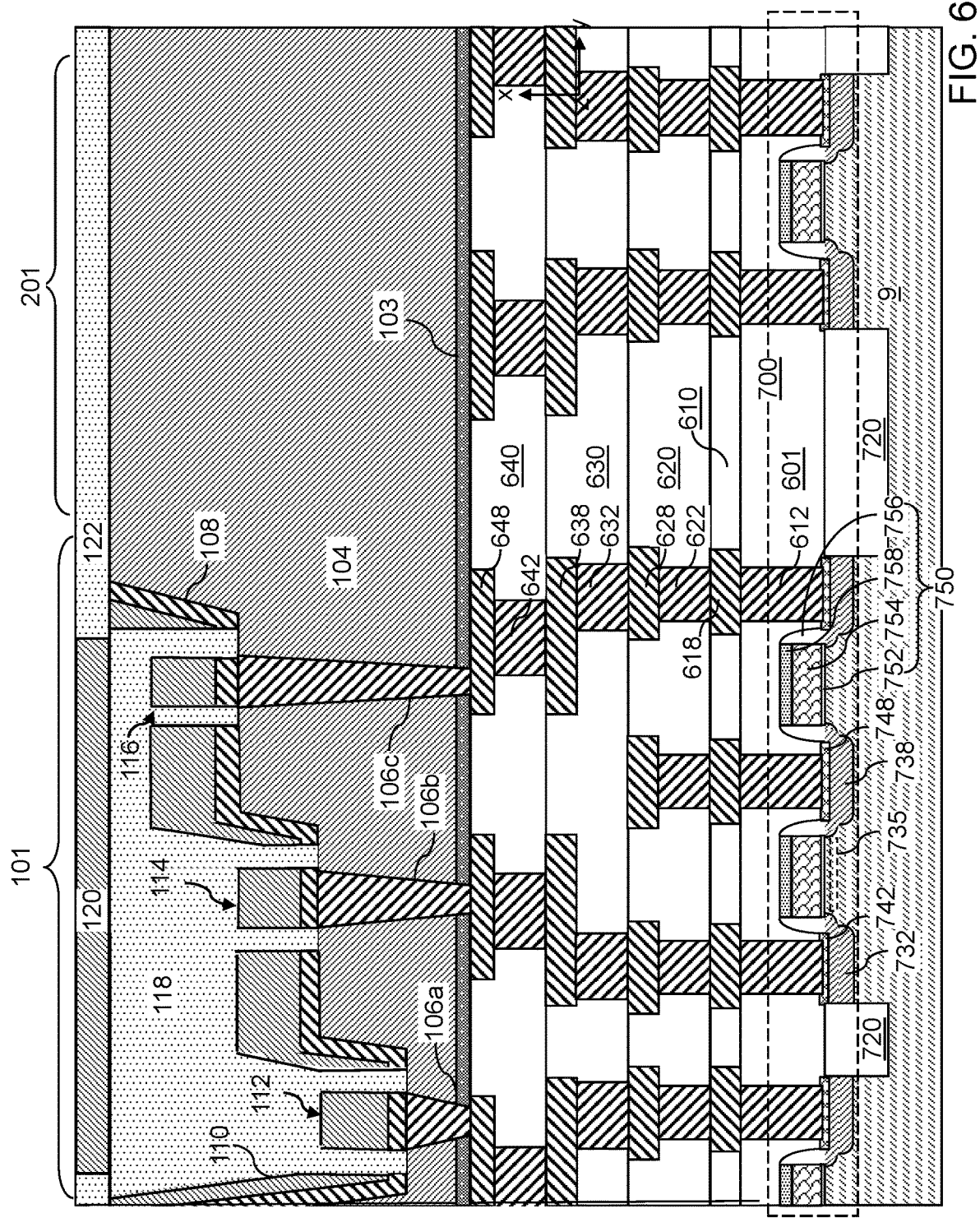
FIG. 6 is a vertical cross-sectional view of an exemplary structure after formation of complementary metal-oxide-semiconductor (CMOS) transistors and metal interconnect structures formed in dielectric material layers according to an embodiment of the present disclosure.

Referring to FIG. 6, an exemplary structure according to an embodiment of the present disclosure is illustrated. FIG. 6 is a vertical cross-sectional view of an exemplary structure after formation of complementary metal-oxide-semiconductor (CMOS) transistors and metal interconnect structures formed in dielectric material layers according to an embodiment of the present disclosure. The exemplary structure includes a substrate 9, which may be a semiconductor substrate such as a commercially available silicon substrate. Shallow trench isolation structures 720 including a dielectric material such as silicon oxide may be formed in an upper portion of the substrate 9. Suitable doped semiconductor wells, such as p-type wells and n-type wells, may be formed within each area that is laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738.

The exemplary structure may include a capacitor control region 101 in which an array of memory elements may be subsequently formed, and a logic region 201 in which logic devices that support operation of the array of memory elements may be formed. In one embodiment, devices (such as field effect transistors) in the capacitor control region 101 may include bottom electrode access transistors that provide access to bottom electrodes of memory cells to be subsequently formed. Top electrode access transistors that provide access to top electrodes of memory cells to be subsequently formed may be formed in the logic region 201 at this processing step. Devices (such as field effect transistors) in the logic region 201 may provide functions that are needed to operate the array of memory cells to be subsequently formed. Specifically, devices in the logic region may be configured to control the programming operation, the erase operation, and the sensing (read) operation of the array of memory cells. For example, the devices in the logic region may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures formed in dielectric material layers may be subsequently formed over the substrate 9 and the devices (such as field effect transistors). The dielectric material layers may include, for example, a contact-level dielectric material layer 601, a first interconnect-level dielectric material layer 610, a second interconnect-level dielectric material layer 620, a third interconnect-level dielectric material layer 630, and a fourth interconnect-level dielectric material layer 640. The metal interconnect structures may include device contact via structures 612 formed in the contact-level dielectric material layer 601 and contact a respective component of the CMOS circuitry 700, first line structures 618 formed in the first interconnect-level dielectric material layer 610, first via structures 622 formed in a lower portion of the second interconnect-level dielectric material layer 620, second line structures 628 formed in an upper portion of the second interconnect-level dielectric material layer 620, second via structures 632 formed in a lower portion of the third interconnect-level dielectric material layer 630, third line structures 638 formed in an upper portion of the third interconnect-level dielectric material layer 630, third via structures 642 formed in a lower portion of the fourth interconnect-level dielectric material layer 640, and fourth line structures 648 formed in an upper portion of the fourth interconnect-level dielectric material layer 640. In one embodiment, the second line structures 628 may include source lines that are connected a source-side power supply for an array of memory elements. The voltage provided by the source lines may be applied to the bottom electrodes through the access transistors provided in the capacitor control region 101.

Each of the contact-level and interconnect-level dielectric layers (601, 610, 620, 630, 640) may include a dielectric material such as undoped silicate glass, a doped silicate glass, organosilicate glass, amorphous fluorinated carbon, porous variants thereof, or combinations thereof. Each of the interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first via structures 622 and the second line structures 628 may be formed as integrated line and via structures by a dual damascene process, the second via structures 632 and the third line structures 638 may be formed as integrated line and via structures, and/or the third via structures 642 and the fourth line structures 648 may be formed as integrated line and via structures. While the present disclosure is described using an embodiment in which an array of memory cells formed over the fourth interconnect-level dielectric material layer 640, embodiments are expressly contemplated herein in which the array of memory cells may be formed at a different interconnect level.

A cap layer 103 and the dielectric layer 104 may be formed over the metal interconnect structures and the interconnect dielectric material layers. For example, the cap layer 103 may be formed on the top surfaces of the fourth line structures 648 and on the top surface of the fourth interconnect-level dielectric material layer 640. The cap layer 103 may include a dielectric capping material that may protect underlying metal interconnect structures such as the fourth line structures 648. In one embodiment, the cap layer 103 may include a material that may provide high etch resistance, i.e., a dielectric material, and also may function as an etch stop material during a subsequent anisotropic etch process that etches the dielectric layer 104. For example, the cap layer 103 may include silicon carbide or silicon nitride, and may have a thickness in a range from 5 nm to 30 nm, although lesser and greater thicknesses may also be used.

The dielectric layer 104 may include any material that may be used for the contact-level and interconnect-level dielectric layers (601, 610, 620, 630, 640). For example, the dielectric layer 104 may include undoped silicate glass or a doped silicate glass deposited by decomposition of tetraethylorthosilicate (TEOS). The cap layer 103 and the dielectric layer 104 may be formed as planar blanket (unpatterned) layers having a respective planar top surface and a respective planar bottom surface that extends throughout the capacitor control region 100 and the logic region 201. The cap layer 103 and the dielectric layer 104 may be etched to form contact via cavities in which conductive contact vias 106a, 106b, and 106c may be formed. The metallic barrier layer 108, metallic capacitance layer 110, first bottom electrode 112, second bottom electrode 114, third bottom electrode 116, second dielectric layer 118, top electrode 120, and dielectric layer 122 may be formed according to various embodiments as described with reference to FIGS. 1A-3B.

Figure 7:
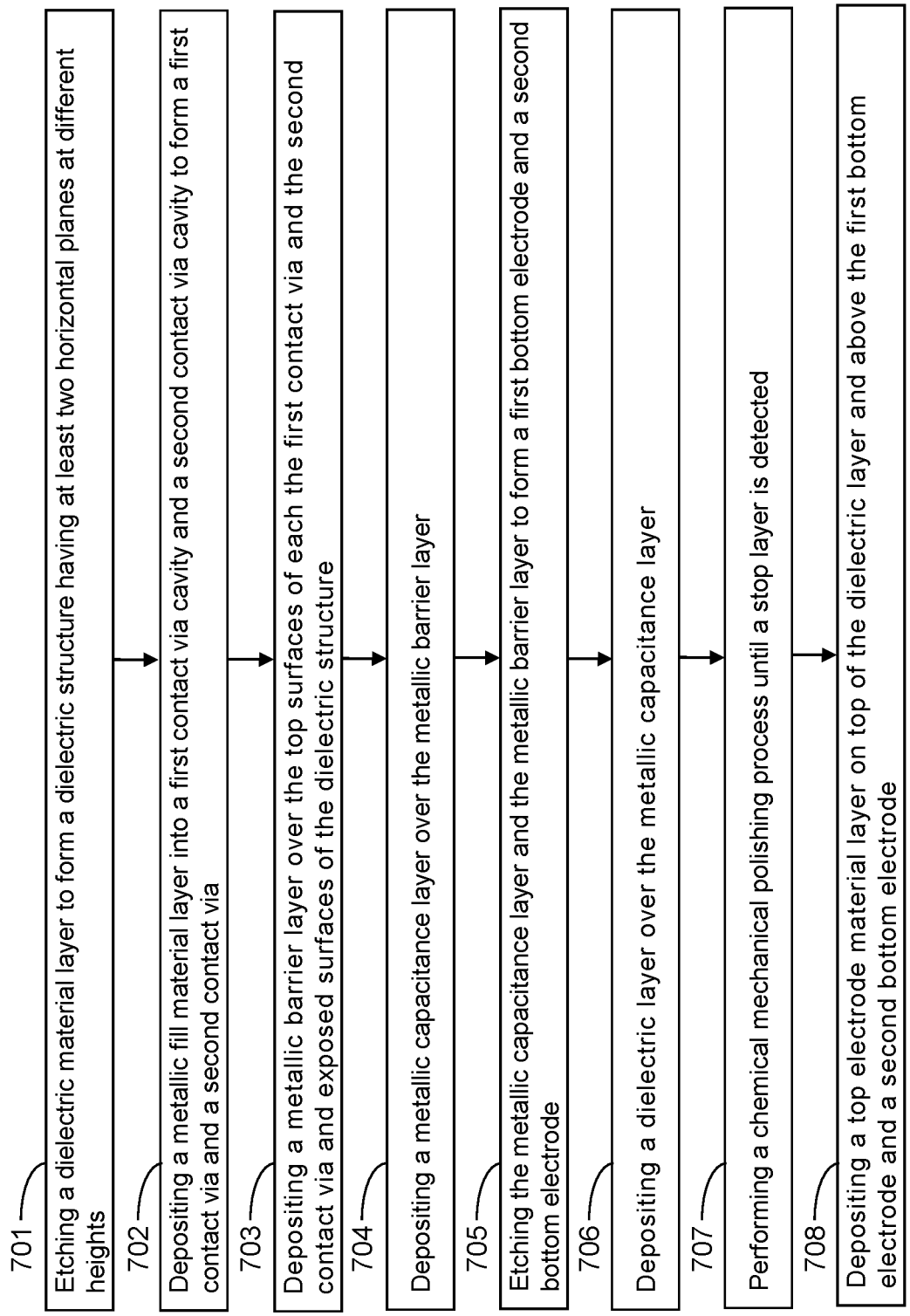
FIG. 7 is a flowchart that illustrates the general processing steps for forming a semiconductor structure including a capacitor structure according to an embodiment of the present disclosure.

Referring to FIG. 7, a flowchart illustrates general processing steps for forming a semiconductor structure including a capacitor structure. Referring to step 701 and FIG. 1A, a dielectric structure 104 may be formed. In particular, a dielectric material layer may be etched to form the dielectric layer 104. The dielectric material layer may be deposited and subsequently patterned and etched to form the graduated, step-like, shape of the dielectric layer 104 shown in FIG. 1A. The dielectric layer 104 may have at least two horizontal planes at different heights, such that the dielectric layer 104 is in the shape of a step-like, graduated structure, in which each horizontal plane of the at least two horizontal planes may contain a contact via cavity (not shown). Referring to step 702 and FIG. 1A, a metallic fill material layer may be deposited into a first contact via cavity (not shown) and a second contact via cavity (not shown) to form a first contact via 106a and a second contact via 106b. First contact via 106a and second contact via 106b are referred to for illustrative purposes. One of ordinary skill may recognize that the at least two horizontal planes at different heights may refer to the height of any combination of contact vias (106a, 106b, and 106c). Referring to step 703 and FIG. 1B, a metallic barrier layer 108 may be deposited over the top surfaces of each the first contact via 106a and the second contact via 106b and exposed surfaces of the dielectric structure 104. Referring to step 704 and FIG. 1C, a metallic capacitance layer 110 may be deposited over the metallic barrier layer 108. Referring to step 705 and FIG. 1D, the metallic capacitance layer 110 and the metallic barrier layer 108 may be etched to form a first bottom electrode 112 and a second bottom electrode 114, in which the first bottom electrode 112 and the second bottom electrode 114 may be positioned above respective contact vias 106 (e.g., 106a and 106b). Referring to step 706 and FIG. 1E, a dielectric layer 118 may be deposited over the metallic capacitance layer 110, in which the dielectric layer 118 may be in contact with sidewalls of the metallic capacitance layer 110 and the metallic barrier layer 108 exposed during the etching process. Referring to step 707 and FIGS. 1F, 2A, and 3A, a CMP process may be performed until a stop layer is detected. Referring to step 708 and FIGS. 1G, 2B, and 3B, a top electrode material layer may be deposited on top of the dielectric layer 118 and above the first bottom electrode 112 and the second bottom electrode 114.

In one embodiment, the top electrode material layer may be etched to form a first top electrode and a second top electrode, wherein the first top electrode is positioned above the first bottom electrode and the second top electrode is positioned above the second bottom electrode.

In one embodiment, referring to FIG. 1F, performing the CMP process until a stop layer is detected may further include detecting a surface of the dielectric structure 104, stopping the CMP process in response to detecting the surface of the dielectric structure 104. In one embodiment, referring to FIG. 2A, performing the CMP process until a stop layer is detected may further include detecting a surface of the metallic barrier layer 108, and stopping the CMP process in response to detecting the surface of the metallic barrier layer 108. In one embodiment, referring to FIG. 3A, performing the CMP process until a stop layer is detected may further include detecting a surface of the metallic capacitance layer 110, and stopping the CMP process in response to detecting the metallic capacitance layer 110.

In one embodiment, a difference between heights of top surfaces of the first bottom electrode 112 and the second bottom electrode 114) may be greater than 20 Å. In one embodiment, the dielectric layer 118 may have a thickness greater than 100 Å.

In one embodiment, etching the metallic capacitance layer 110 and the metallic barrier layer 108 to form a first bottom electrode 112 and a second bottom electrode 114 may further include etching the metallic capacitance layer 110 and the metallic barrier layer 108 to expose top surfaces of the dielectric structure 104 adjacent to the top surfaces of the first contact via 106a and the second contact via 106b, in which the etching electrically separates the first bottom electrode 112 and the second bottom electrode 114.

Referring to all drawings and according to various embodiments of the present disclosure, a semiconductor structure comprising a capacitor structure is provided. The capacitor structure includes a first capacitor and a second capacitor. The first capacitor may include a first bottom electrode 112 and a top electrode 120 having a bottom surface that is a first distance from a top surface of the first bottom electrode 112. The second capacitor may include a second bottom electrode 114 and the top electrode 120, in which the bottom surface is a second distance from a top surface of the second bottom electrode 114, and in which the first distance is different from the second distance. In one embodiment, a difference between the first distance and the second distance may be greater than 20 Å. In one embodiment, the semiconductor structure may further include a third capacitor comprising a third bottom electrode 116 and the top electrode 120, in which the bottom surface is a third distance from a top surface of the third bottom electrode 116, and in which the third distance is different from the first distance and the second distance. In one embodiment, a difference between the third distance and the first distance may be greater than 40 Å, and a difference between the third distance and the second distance may be greater than 20 Å. In one embodiment, the semiconductor structure may further include at least one dielectric material layer 118 located between the first bottom electrode 112 and the top electrode 120 and between the second bottom electrode 114 and the top electrode 120, in which the at least one dielectric material layer 118 has a thickness greater than 100 Å. In one embodiment, the at least one dielectric material layer 118 may include at least one of undoped silicon glass, silicon nitride, phosphosilicate glass, fluorosilicate glass, low-k material, extreme low-k material, or black diamond. In one embodiment, the at least one dielectric material layer 118 may be in contact with sidewalls of the first bottom electrode 112 and the second bottom electrode 114. In one embodiment, the semiconductor structure may further include a first contact via 106, a first metallic barrier layer 108 positioned between the first contact via 106 and a bottom surface of the first bottom electrode 112, a second contact via 106, and a second metallic barrier layer 108 positioned between the second contact via 106 and a bottom surface of the second bottom electrode 114.

Referring to all drawings and according to various embodiments of the present disclosure, a capacitor structure is provided, which includes a dielectric structure 104 including at least two horizontal planes at different heights, in which the at least two horizontal planes are in the shape of a step-like, graduated structure. The dielectric structure may further include two sidewalls 102, in which the at least two horizontal planes are positioned between the two sidewalls 102, and in which the two sidewalls 102 have heights greater than the at least two horizontal planes. The capacitor structure may further include at least two contact vias 106, in which each horizontal plane of the at least two horizontal planes may be embedded with a contact via 106 that has a top surface that is planarized with each respective horizontal plane. The capacitor structure may further include at least two bottom electrodes (112, 114, 116), wherein each bottom electrode of the at least two bottom electrodes (112, 114, 116) may be positioned above a top surface of a respective contact via of the at least two contact vias 106. The capacitor structure may further include a dielectric layer 118, in which the dielectric layer 118 may be in contact with sidewalls and top surfaces of the at least two bottom electrodes (112, 114, 116). The capacitor structure may further include a top electrode 120 positioned on the dielectric layer 118 and positioned vertically above the at least two bottom electrodes (112, 114, 116).

In one embodiment, a difference between heights of top surfaces of a bottom electrode of the at least two bottom electrodes (112, 114, 116) and any adjacent bottom electrode is greater than 20 Å. In one embodiment, the dielectric layer 118 may have a thickness greater than 100 Å between a bottom surface of the top electrode 120 and a top surface of the topmost bottom electrode 116 of the at least two bottom electrodes (112, 114, 116). In one embodiment, the at least two contact vias 106 and the at least two bottom electrodes (112, 114, 116) may each include at least one of W, Cu, Ru, Mo, Al, AlCu, or AlSiCu. In one embodiment, the capacitor structure may further include metallic barrier layers 108 positioned between bottom surfaces of the at least two bottom electrodes (112, 114, 116) and top surfaces of the at least two contact vias 106, wherein the metallic barrier layers 108 include at least one of Ti, Ta, TiN, TaN, or W.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
    forming a stepped cavity in a first dielectric material layer, wherein the stepped cavity comprises a stepped bottom surface comprising a first horizontal recessed surface and a second horizontal recessed surface located at different heights connected by a first tapered sidewall;
    depositing a layer stack including a metallic barrier layer and a metallic capacitance layer over the first horizontal recessed surface and the second horizontal recessed surface;
    patterning the layer stack, wherein patterned portions of the layer stack comprise a first bottom electrode and a second bottom electrode, wherein the first bottom electrode comprises a first patterned portion of the metallic barrier layer and a first patterned portion of the metallic capacitance layer and the second bottom electrode comprises a second patterned portion of the metallic barrier layer and a second patterned portion of the metallic capacitance layer, wherein the first bottom electrode is formed on the first horizontal recessed surface and the second bottom electrode is formed on the second horizontal recessed surface;
    depositing a second dielectric material layer over the first bottom electrode and the second bottom electrode;
    planarizing the second dielectric material layer so that a planarized top surface of the second dielectric material layer is located entirely within a horizontal plane; and
    forming a top electrode above the first bottom electrode and the second bottom electrode on the planarized top surface of the second dielectric material layer.

2. The method of claim 1, further comprising forming a first contact via structure and a second contact via structure in the first dielectric material layer, wherein the first contact via structure extends from the first horizontal recessed surface downward through the first dielectric material layer to a bottom surface of the first dielectric material layer, and the second contact via structure extends from the second horizontal recessed surface downward through the first dielectric material layer to the bottom surface of the first dielectric material layer.

3. The method of claim 2, wherein:
    the first bottom electrode is formed on a top surface of the first contact via structure; and
    the second bottom electrode is formed on a top surface of the second contact via structure.

4. The method of claim 1, wherein:
    the stepped cavity comprises a pair of additional tapered sidewalls that adjoin a top surface of a remaining portion of the first dielectric layer after planarizing the second dielectric material layer; and two metallic material portions having a same material composition as the first bottom electrode and the second bottom electrode are located on the pair of additional tapered sidewalls.

5. The method of claim 4, wherein top surfaces of the two metallic material portions are formed within the horizontal plane.

6. The method of claim 1, wherein patterned portions of the layer stack comprise additional metallic material portions that overlie a top surface of the first dielectric material layer.

7. The method of claim 6, wherein:
planarizing the second dielectric material layer comprises performing a chemical mechanical polishing (CMP) process until a remaining portion of the metallic capacitance layer is detected; and
stopping the CMP process in response to detection of the remaining portion of the metallic capacitance layer.

8. The method of claim 6, wherein:
planarizing the second dielectric material layer comprises performing a chemical mechanical polishing (CMP) process until a remaining portion of the metallic barrier layer is detected; and
stopping the CMP process in response to detection of the remaining portion of the metallic barrier layer.

9. The method of claim 6, wherein:
planarizing the second dielectric material layer comprises performing a chemical mechanical polishing (CMP) process until the first dielectric material layer is detected; and
stopping the CMP process in response to detection of a remaining portion of the first dielectric material layer.

10. The method of claim 6, wherein the additional metallic material portions further comprise vertically-extending metallic material portions that contact sidewalls of the stepped cavity.

11. The method of claim 1, further comprising:
depositing a top electrode material layer on the planarized top surface of the second dielectric material layer; and
patterning the top electrode material layer, wherein a patterned portion of the top electrode material layer comprise the top electrode.

12. The method of claim 1, wherein the second dielectric material layer is deposited directly on a segment of the first horizontal recessed surface which is a first surface segment of the first dielectric material layer, and is deposited directly on a segment of the second horizontal recessed surface which is a second surface segment of the first dielectric material layer.

13. A method of forming a semiconductor structure, the method comprising:
forming a cavity in a first dielectric material layer, wherein the cavity comprises a stepped bottom surface comprising a first horizontal recessed surface and a second horizontal recessed surface located at different heights connected by a first tapered sidewall;
depositing a layer stack including a metallic barrier layer and a metallic capacitance layer over the first horizontal recessed surface and the second horizontal recessed surface;
patterning the layer stack, wherein patterned portions of the layer stack comprise a first bottom electrode and a second bottom electrode, wherein the first bottom electrode comprises a first patterned portion of the metallic barrier layer and a first patterned portion of the metallic capacitance layer and the second bottom electrode comprises a second patterned portion of the metallic barrier layer and a second patterned portion of the metallic capacitance layer, wherein the first bottom electrode and the second bottom electrode are formed at a bottom of the cavity;
depositing a second dielectric material layer over the first bottom electrode and the second bottom electrode, wherein all sidewalls of the first bottom electrode and the second bottom electrode contact the second dielectric material layer;
planarizing the second dielectric material layer so that a planarized top surface of the second dielectric material layer is located entirely within a first horizontal plane; and
forming a top electrode material layer above the first bottom electrode and the second bottom electrode on the planarized top surface of the second dielectric material layer.

14. The method of claim 13, wherein
the first bottom electrode is formed on the first horizontal recessed surface and the second bottom electrode is formed on the second horizontal recessed surface.

15. The method of claim 13, further comprising forming a first contact via structure and a second contact via structure in the first dielectric material layer, wherein bottom surfaces of the first contact via structure and the second contact via structure are formed within a second horizontal plane, and wherein the first contact via structure and the second contact via structure have different heights.

16. The method of claim 15, wherein:
the first bottom electrode is formed on a top surface of the first contact via structure; and
the second bottom electrode is formed on a top surface of the second contact via structure.

17. The method of claim 13, wherein the first bottom electrode and the second bottom electrode have a same thickness and a same material composition.

18. The method of claim 13, wherein:
the cavity comprises a pair of tapered sidewalls that adjoin a top surface of a remaining portion of the first dielectric layer after planarizing the second dielectric material layer; and
two metallic material portions having a same material composition as the first bottom electrode and the second bottom electrode are located on the pair of additional tapered sidewalls and have a respective top surface that is located within the first horizontal plane.

19. A method of forming a semiconductor structure, the method comprising:
forming field effect transistors on a substrate;
forming metal interconnect structures embedded in dielectric material layers over the field effect transistors;
forming a first dielectric material layer over the metal interconnect structures and the dielectric material layers;
forming a combination of a stepped cavity, a first contact via structure, and a second contact via structure in the first dielectric material layer, wherein the stepped cavity comprise a stepped bottom surface comprising a first horizontal recessed surface and a second horizontal recessed surface located at different heights connected by a first tapered sidewall, and wherein the first contact via structure extends from the first horizontal recessed surface downward through the first dielectric material layer to a first one of the metal interconnect structures, and the second contact via structure extends from the second horizontal recessed surface downward through the first dielectric material layer to a second one of the metal interconnect structures;

depositing a layer stack including a metallic barrier layer and a metallic capacitance layer over the first horizontal recessed surface and the second horizontal recessed surface;

patterning the layer stack, wherein patterned portions of the layer stack comprise a first bottom electrode and a second bottom electrode, wherein the first bottom electrode comprises a first patterned portion of the metallic barrier layer and a first patterned portion of the metallic capacitance layer and the second bottom electrode comprises a second patterned portion of the metallic barrier layer and a second patterned portion of the metallic capacitance layer, wherein the first bottom electrode is formed on the first horizontal recessed surface and the second bottom electrode is formed on the second horizontal recessed surface;

depositing and planarizing a second dielectric material layer over the first bottom electrode and the second bottom electrode; and forming a top electrode above the first bottom electrode and the second bottom electrode on a top surface of the second dielectric material layer.

20. The method of claim 19, wherein:

the patterned portions of the layer stack comprise additional metallic material portions that overlie a top surface of the first dielectric material layer; and the second dielectric material layer is formed on all sidewalls of the first bottom electrode and the second bottom electrode and over the additional metallic material portions.

* * * * *